United States Patent
Wu et al.

(10) Patent No.: US 12,164,335 B2
(45) Date of Patent: Dec. 10, 2024

(54) DISPLAY APPARATUS AND ELECTRONIC DEVICE

(71) Applicants: CHENGDU BOE OPTOELECTRONICS TECHNOLOGY CO., LTD., Chengdu Sichuan (CN); BOE TECHNOLOGY GROUP CO., LTD., Beijing (CN)

(72) Inventors: Weihong Wu, Beijing (CN); Shuang Zhang, Beijing (CN); Yong Yu, Beijing (CN); Chang Zhang, Beijing (CN)

(73) Assignees: BEIJING BOE TECHNOLOGY DEVELPOMENT CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 266 days.

(21) Appl. No.: 17/788,437

(22) PCT Filed: May 12, 2021

(86) PCT No.: PCT/CN2021/093384
§ 371 (c)(1),
(2) Date: Jun. 23, 2022

(87) PCT Pub. No.: WO2022/001394
PCT Pub. Date: Jan. 6, 2022

(65) Prior Publication Data
US 2023/0027802 A1 Jan. 26, 2023

(30) Foreign Application Priority Data
Jun. 30, 2020 (CN) .......................... 202010614403.0

(51) Int. Cl.
*G06F 1/16* (2006.01)

(52) U.S. Cl.
CPC .................. *G06F 1/1652* (2013.01)

(58) Field of Classification Search
None
See application file for complete search history.

(56) References Cited

U.S. PATENT DOCUMENTS 7,012,667 B2    3/2006  Pai
10,817,082 B1 * 10/2020  Yildiz ................. G06F 3/03545
(Continued)

FOREIGN PATENT DOCUMENTS

CN    1578613 A    2/2005
CN    101266762 A  9/2008
(Continued)

OTHER PUBLICATIONS

Shuguang Jing, Flat-panel color TV repair secret skills, 1.1.4 Logic board, pp. 4-5.

*Primary Examiner* — Anthony Q Edwards
*Assistant Examiner* — Rashen E Morrison
(74) *Attorney, Agent, or Firm* — Lippes Mathias LLP

(57) ABSTRACT

A display apparatus and an electronic device. The display apparatus includes a flexible display panel, a plurality of driver integrated circuits, a logic board, and a circuit board. The driver integrated circuits are disposed on a first surface of the flexible display panel and on a peripheral region; and the circuit boards is electrically connected to the driver integrated circuits and the logic board, respectively. A first bendable section of the circuit board is configured to be bent to a second surface of the flexible display panel along a first side edge; a second bendable section of the circuit board is configured to be bent at a side where the second surface is disposed, such that the logic board protrudes from the first side edge; and a third bendable section of the circuit board is configured to bypass a hinge shaft of the electronic device.

18 Claims, 19 Drawing Sheets

(56) References Cited

U.S. PATENT DOCUMENTS

| | | | |
|---|---|---|---|
| 11,304,300 B2* | 4/2022 | Woo | H05K 1/148 |
| 11,388,820 B2* | 7/2022 | Guo | H05K 1/118 |
| 2004/0266239 A1 | 12/2004 | Kurokawa | |
| 2012/0013592 A1 | 1/2012 | Park et al. | |
| 2013/0329382 A1 | 12/2013 | Jung | |
| 2014/0043577 A1 | 2/2014 | Kim et al. | |
| 2014/0049895 A1* | 2/2014 | Lee | G06F 1/1681 |
| | | | 361/679.28 |
| 2014/0218629 A1 | 8/2014 | Chuang et al. | |
| 2015/0230337 A1 | 8/2015 | Kim et al. | |
| 2017/0003801 A1 | 1/2017 | Liu et al. | |
| 2019/0189058 A1 | 6/2019 | Cho et al. | |
| 2019/0350081 A1* | 11/2019 | Park | H05K 1/147 |
| 2020/0351393 A1* | 11/2020 | Kang | H04M 1/0216 |
| 2021/0135492 A1* | 5/2021 | Kim | H02J 7/02 |
| 2021/0168937 A1* | 6/2021 | Guo | G02B 6/0083 |

FOREIGN PATENT DOCUMENTS

| | | |
|---|---|---|
| CN | 101754571 A | 6/2010 |
| CN | 101902873 A | 12/2010 |
| CN | 102339583 A | 2/2012 |
| CN | 103582296 A | 2/2014 |
| CN | 103984452 A | 8/2014 |
| CN | 107484328 A | 12/2017 |
| CN | 104731421 B | 2/2018 |
| CN | 109935186 A | 6/2019 |
| CN | 212782503 U | 3/2021 |
| JP | 4572140 B2 | 10/2010 |
| KR | 20140097857 A | 8/2014 |
| KR | 20170029761 A | 3/2017 |

* cited by examiner

DISPLAY APPARATUS AND ELECTRONIC DEVICE

CROSS-REFERENCE TO RELATED APPLICATION

The present disclosure is a 371 of PCT Patent Application Serial No. PCT/CN2021/093384, filed on May 12, 2021, which claims priority to Chinese Patent Application No. 202010614403.0, filed on Jun. 30, 2020 and entitled "DISPLAY APPARATUS AND ELECTRONIC DEVICE", the contents of both of which are incorporated in the present disclosure by reference in their entirety.

TECHNICAL FIELD

The present disclosure relates to the field of display, and in particular, relates to a display apparatus and an electronic device.

BACKGROUND

Electronic devices, such as cameras and notebook computers, with a foldable screen are common in people's lives. An electronic device with the foldable screen includes a display screen and a body, which are hinged to each other. The body is integrated with electronic parts, for example, a processor a graphics card, and the like therein. The processor is electrically connected to the display screen to control the display screen to display images.

SUMMARY

Embodiments of the present disclosure provide a display apparatus and an electronic device.

In an aspect, the present disclosure provides a display apparatus. The display apparatus includes:
  a flexible display panel including a display region and a peripheral region surrounding the display region;
  a plurality of driver integrated circuits disposed on a first surface of the flexible display panel and on the peripheral region, wherein the plurality of driver integrated circuits is spaced apart along a first side edge of the flexible display;
  a logic board including an interface configured to be electrically connected to a processor of an electronic device; and
  a circuit board connected between the flexible display panel and the logic board, wherein the circuit board is electrically connected to the driver integrated circuits and the logic board;
  wherein the circuit board includes a first bendable section, a second bendable section, and a third bendable section; wherein the first bendable section is configured to be bent to a second surface of the flexible display panel along the first side edge, the second surface and the first surface being two opposite surfaces of the flexible display panel; the second bendable section is configured to be bent at a side where the second surface is disposed, such that the logic board protrudes from the first side edge; and the third bendable section is configured to bypass a hinge shaft of the electronic device.

In an embodiment of the present disclosure, the circuit board includes:
  at least one first flexible printed circuit board electrically connected to at least one of the driver integrated circuits, wherein the first bendable section is at least a portion of the first flexible printed circuit board;
  a printed circuit board electrically connected to the at least one first flexible printed circuit board, wherein the printed circuit board is disposed on the second surface; and
  a second flexible printed circuit board including one terminal electrically connected to the printed circuit board and the other terminal electrically connected to the logic board, wherein the second bendable section and the third bendable section each are at least a portion of the second flexible printed circuit board.

In an embodiment of the present disclosure, the at least one first flexible printed circuit board and the driver integrated circuit boards are electrically connected in one-to-one correspondence.

In an embodiment of the present disclosure, the circuit board includes:
  third flexible printed circuit boards electrically connected to at least one of the driver integrated circuits, wherein the first bendable section is at least a portion of each of the third flexible printed circuit board; and
  a fourth flexible printed circuit board including a first terminal and a second terminal that are opposite to each other, wherein the first terminal is electrically connected to at least two of the third flexible printed circuit boards, the second terminal is electrically connected to the logic board, and the second bendable section and the third bendable section are each at least a portion of the fourth flexible printed circuit board.

In an embodiment of the present disclosure, each of the third flexible printed circuit boards includes a main body and at least two first branches connected to the main body, wherein each of the first branches is electrically connected to one of the driver integrated circuits; or
  the third flexible printed circuit boards are electrically connected to the driver integrated circuits in one-to-one correspondence.

In an embodiment of the present disclosure, a first terminal of the fourth flexible printed circuit board includes at least two second branches, wherein each of the second branches is electrically connected to one of the third flexible printed circuit boards; or
  the fourth flexible printed circuit board includes a transversal extension portion extending along a direction in which the driver integrated circuits are arranged, and a longitudinal connection portion perpendicularly connected to the transversal extension portion, wherein the transversal extension portion is electrically connected to at least two of the third flexible printed circuit boards, and the longitudinal connection portion is electrically connected to the logic board.

In an embodiment of the present disclosure, the circuit board includes:
  at least two fifth flexible printed circuit boards, wherein each of the fifth flexible printed circuit boards includes one terminal electrically connected to at least two of the driver integrated circuits, and the other terminal electrically connected to the logic board.

In an embodiment of the present disclosure, the logic board includes at least two first connectors; and
  the circuit board includes at least two third branches at one terminal thereof, wherein each of the third branches includes one second connector, and the first connectors are electrically connected to the second connectors in one-to-one correspondence.

In an embodiment of the present disclosure, each of the first bendable section, the second bendable section, and the third bendable section is a single-layer structure.

In an embodiment of the present disclosure, a quantity of the driver integrated circuits is between 4 and 10.

In an embodiment of the present disclosure, the logic board includes a carrier circuit board and a plurality of electronic components, wherein the carrier circuit board includes two opposite carrying surfaces, and the plurality of electronic components are disposed on the two carrying surfaces.

In another aspect, the present disclosure provides a display apparatus. The display apparatus includes:
- a flexible display panel including a display region and a peripheral region surrounding the display region;
- a plurality of driver integrated circuits disposed on a first surface of the flexible display panel and on the peripheral region, wherein the plurality of driver integrated circuits is spaced apart along a first side edge of the flexible display;
- a printed circuit board disposed on a second surface of the flexible display panel;
- a first flexible printed circuit board including a first bendable section, wherein the first flexible printed circuit board includes one terminal electrically connected to the driver integrated circuits, and the other terminal which is turned over to the second surface of the flexible display panel via the first bendable section and is electrically connected to the printed circuit board, and the second surface and the first surface are two opposite surfaces of the flexible display panel;
- a logic board including an interface configured to be electrically connected to a processor of an electronic device; and
- a second flexible printed circuit board including one terminal electrically connected to the printed circuit board; and the other terminal electrically connected to the logic board, wherein the second flexible printed circuit board includes a second bendable section and a third bendable section, the second bendable section being configured to be turned over at a side where the second surface is disposed, such that the third bendable section and the logic board protrude from the first side edge, and the third bendable section being configured to bypass a hinge shaft of the electronic device.

In an embodiment of the present disclosure, the logic board includes at least two first connectors; the other terminal of the second flexible printed circuit board includes two third branches, each of the third branches including one second connector; and the first connectors are electrically connected to the second connectors in one-to-one correspondence, such that the second flexible printed circuit board is electrically connected to the logic board.

In an embodiment of the present disclosure, the second flexible printed circuit board includes a single-layer board region and a double-layer board region which are connected to each other, wherein the second bendable section and the third bendable section are both disposed on the single-layer board region, and the second connectors are disposed on the double-layer board region.

In another aspect, the present disclosure provides an electronic device. The electronic device includes a display screen and a body, wherein the display screen and the body are hinged by a hinge shaft, the body includes a processor therein, and the display screen includes the display apparatus according to any one of the above aspects, the processor being electrically connected to the interface of the logic board.

In an embodiment of the present disclosure, the electronic device includes a notebook computer.

The technical solutions according to the embodiments of the present disclosure achieve the following beneficial effects.

In the embodiments of the present disclosure, the plurality of driver integrated circuits are spaced apart on the peripheral region of the flexible panel along the first side edge of the flexible display panel, and the driver integrated circuits are electrically connected to the logic board via the circuit board on which three bendable sections are configured, such that the circuit board allows the logic board, via the three bendable sections, to protrude from the first side edge of the flexible display panel and bypass the hinge shaft of the electrode device. In this way, the logic board is not disposed on the flexible display panel, which reduces the thickness of the flexible display panel. Meanwhile, the circuit board is bent to the second surface of the flexible display panel via the first bendable section, such that the length of the circuit board on the first side edge of the flexible display panel is reduced, thereby reducing the width of a non-display region at the first side edge of the flexible display panel and hence narrowing down a frame of the display apparatus.

BRIEF DESCRIPTION OF THE DRAWINGS

For clearer descriptions of the technical solutions in the embodiments of the present disclosure, the following briefly introduces the accompanying drawings required to be used in the descriptions of the embodiments. Apparently, the accompanying drawings in the following description show merely some embodiments of the present disclosure, and persons of ordinary skills in the art may still derive other drawings from these accompanying drawings without creative efforts.

DETAILED DESCRIPTION

For clearer descriptions of the objectives, technical solutions, and advantages of the present disclosure, the embodiments of the present disclosure are further described in detail hereinafter in conjunction with the accompanying drawings.

In the related art, a display screen includes a display panel and a logic board integrated on the back of the display panel. The logic board is also referred to as a timing control (T-CON) board, and is electrically connected to a processor of an electronic device via a flexible printed circuit (FPC). The processor supplies a control signal to the display screen via the flexible printed circuit board to control the display screen to display images. However, integrating the logic board on the back of the display panel increases the thickness of the display screen, and thus the requirement of a foldable electronic device for the thickness of the display screen fails to be met.

Figure 1:
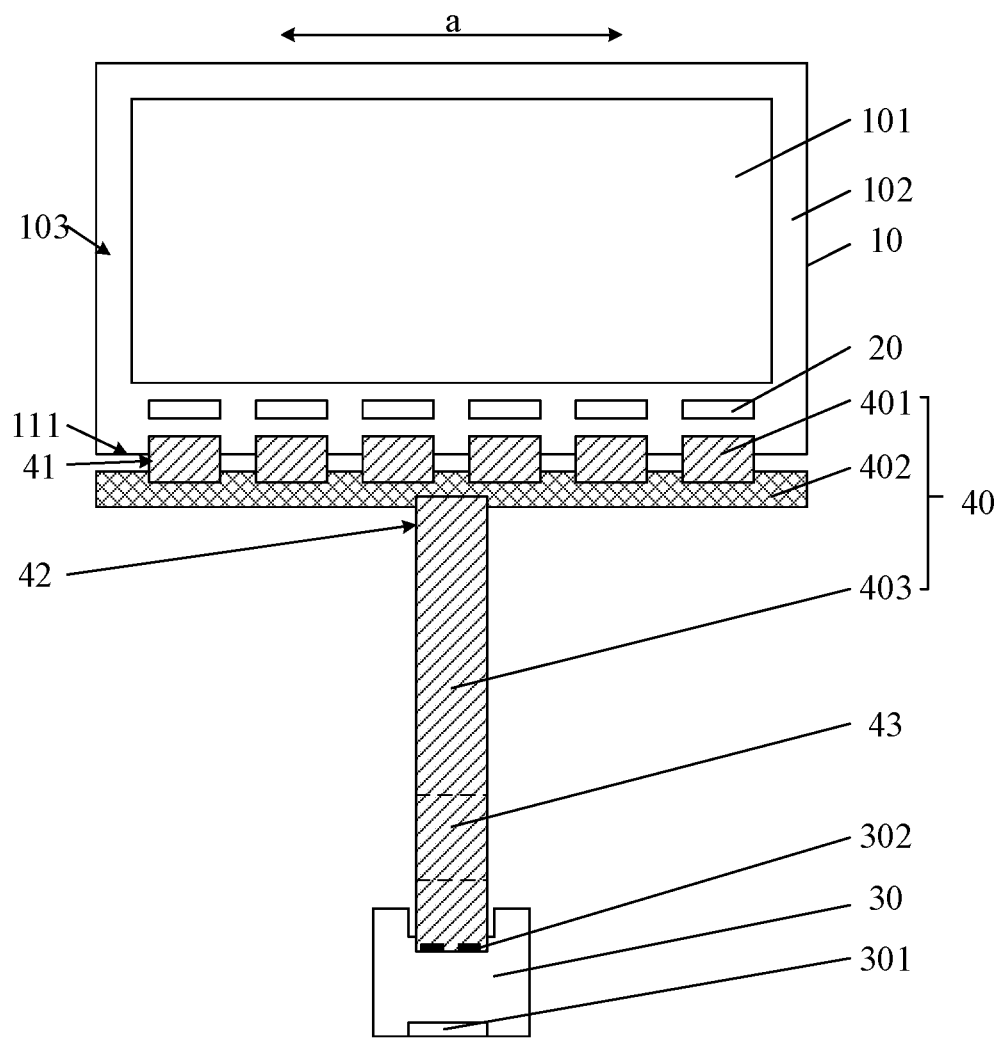
FIG. 1 is a front view of a display apparatus according to an embodiment of the present disclosure.

FIG. 1 is a front view of a display apparatus according to an embodiment of the present disclosure. Referring to FIG. 1, the display apparatus includes a flexible display panel 10, a plurality of driver integrated circuits (ICs) 20, a logic board 30, and a circuit board 40.

The flexible display panel 10 includes a display region 101 and a peripheral region 102 surrounding the display region 101.

In an embodiment of the present disclosure, the display region 101 is configured to display images, and the peripheral region 102 is disposed surrounding the display region 101. In an example, the display region 101 includes a plurality of gate lines extending along a first direction and a plurality of data lines extending along a second direction. The first direction and the second direction are perpendicular to each other. The plurality of gate lines and the plurality of data lines are intersected to define a plurality of pixel regions. Each of the pixel regions is provided with a pixel. Each of the pixels includes a light-emitting diode, for example, an organic light-emitting diode (MED). The peripheral region 102 is configured to deploy driver ICs, various signal lines, and the like.

The plurality of driver ICs 20 are disposed on the peripheral region 102, and are spaced apart along a first side edge 111 of the flexible display panel 10. That is, the driver ICs 20 being spaced apart along the first side edge 111 means that the plurality of driver ICs 20 are arranged in a direction the same as a direction in which the first side edge 111 extends. The logic board 30 includes an interface 301 configured to electrically connected to a processor of an electronic device. The circuit board 40 includes one terminal electrically connected to the driver ICs 20, and the other terminal electrically connected to the logic board 30. The circuit board 40 includes a first bendable section 41, a second bendable section 42, and a third bendable section 43. In the case that the circuit board 40 is not bent, the first bendable section 41, the second bendable section 42, and the third bendable section 43 are sequentially arranged on the circuit board 40 in a direction from the terminal of the circuit board 40 electrically connected to the flexible display panel 10 to the terminal of the circuit board 40 electrically connected to the logic board 30. The flexible display panel 10 is provided with pads, which are electrically connected to the driver ICs 20 and the circuit board 40 respectively. The pads electrically connected to the driver ICs 20 and the pads electrically connected to the circuit board 40 are electrically connected via wires.

Figure 2:
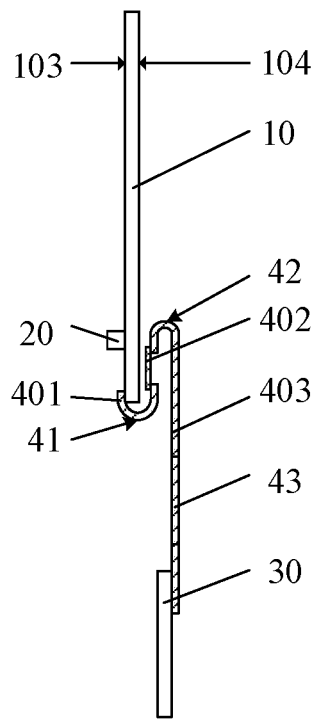
FIG. 2 is a left view of a display apparatus according to an embodiment of the present disclosure.
Figure 3:
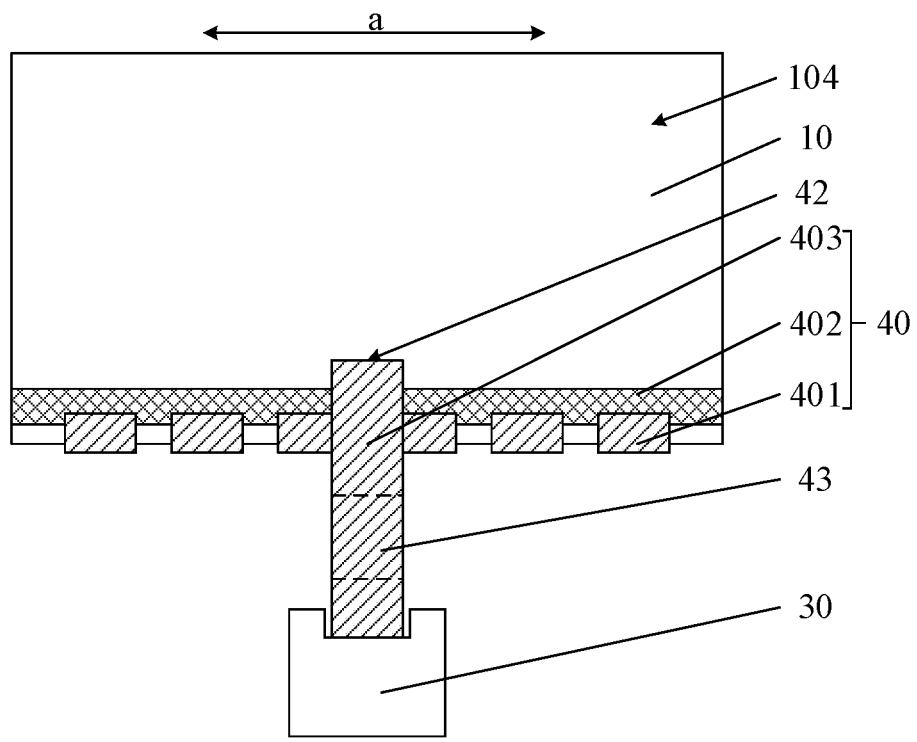
FIG. 3 is a rear view of the display apparatus shown in FIG. 1.

FIG. 2 is a left view of a display apparatus according to an embodiment of the present disclosure. FIG. 3 is a rear view of a display apparatus according to an embodiment of the present disclosure. FIG. 1 is the front view in the case that the circuit board is not bent, and FIGS. 2 and 3 are rear views after the circuit board is bent. Referring to FIGS. 2 and 3, the flexible display panel 10 includes a first surface 103 and a second surface 104 that are opposite to each other. The plurality of driver ICs 20 are all disposed on the first surface 103 of the flexible display panel 10. The first bendable section 41 is configured to be bent to the second surface 104 of the flexible display panel 10 along the first side edge 111. The second bendable section 42 is configured to be bent at a side where the second surface 104 is disposed, such that the logic board 30 protrudes from the first side edge 111. The third bendable section 43 is configured to bypass a hinge shaft of the electronic device.

In an example, the flexible display panel 10 includes an array substrate, a light-emitting device layer, and a packaging layer that are stacked in sequence; and the driver ICs 20 are disposed on a surface of the packaging layer of the flexible display panel 10.

In an example, the first bendable section 41 being configured to be bent to the second surface 104 of the flexible display panel 10 along the first side edge ill means that, at the first bendable section 41, the circuit board 40 is bent by bypassing at least a portion of the first side edge 111 (for example, bypassing one region or a plurality of separated regions of the first side edge 111), such that a portion of the circuit board 40 is disposed on the second surface 104 of the flexible display panel 10.

In the embodiment of the present disclosure, the plurality of driver integrated circuits are spaced apart on the peripheral region of the flexible panel along the first side edge of the flexible display panel, and the driver integrated circuits are electrically connected to the logic board via the circuit board on which three bendable sections are configured, such that the circuit board allows the logic board, via these three bendable sections, to protrude from the first side edge of the flexible display panel and bypass the hinge shaft of the electrode device. In this way, the logic board is not disposed on the flexible display panel, which reduces the thickness of the flexible display panel. Meanwhile, the circuit board is bent to the second surface of the flexible display panel via the first bendable section, such that the length of the circuit board on the first side edge of the flexible display panel is reduced, thereby reducing the width of a non-display region at the first side edge of the flexible display panel and hence narrowing down a frame of the display apparatus.

In the embodiment of the present disclosure, the plurality of driver ICs 20 are disposed on the flexible display panel 10 in the form of chip on panel (COP) packaging. In order to accommodate the plurality of driver ICs 20, the first side edge 111 is relatively long and is not easy to bend, and where the flexible display panel is forcibly bent, the driver ICs 20 would be easily damaged. Therefore, in the embodiment of the present disclosure, the frame of the display apparatus is reduced in size by bending the circuit board 40, which protects the driver ICs 20 and avoid damages to the driver ICs 20 during their bending as compared to directly bending the flexible display panel.

In an embodiment of the present disclosure, the number of driver ICs 20 is between 4 and 10.

For medium-sized and large-sized electronic devices, as the area of the display region 101 increases, the number of pixels arranged in the display region 101 would also be increased. Meanwhile, in order to improve the resolution of the display apparatus, the number of pixels within the display region 101 would be further increased, and accordingly, the number of wires on the flexible display panel is also increased. However, the number of pins of one driver IC is limited, and thus, more driver ICs 20 need to be arranged and electrically connected to the wires in the display apparatus.

Optionally, in the embodiment of the present disclosure, the number of the driver ICs 20 is six, and the following describes the display apparatus of the present disclosure by taking the six driver ICs 20 as an example.

In the embodiment of the present disclosure, the first surface 103 of the flexible display panel 10 is a surface on which the flexible display panel 10 displays images, that is, the first surface 103 is a display surface of the flexible display panel 10; and the second surface 104 is a back surface of the flexible display panel 10.

In the embodiment of the present disclosure, the interface 301 of the logic board 30 is electrically connected to the processor of the electronic device, and the processor sends a control signal to the driver ICs 20 via the logic board 30 and the circuit board 40 to control the display panel to display images.

Optionally, the interface 301 is a connector. The processor is also provided with a connector, by which the logic board 30 and the processor are electrically connected, thereby facilitating assembly and disassembly of the logic board 30 and the processor.

In the embodiment of the present disclosure, the circuit board 40 is bent at the first bendable section 41 from the first surface 103 of the flexible display panel 10 to the second surface 104 of the flexible display panel 10; and the circuit board 40 is bent at the second bendable section 42 from a side, where the second surface 104 of the flexible display panel 10 is disposed, to a side of the peripheral region 102, and is opposite to the first side edge 111.

The third bendable section 43 being configured to bypass the hinge shaft of the electronic device means that the third bendable section 43 is configured to move by fitting a peripheral wall of the hinge shaft in the case that the display screen of the electronic device rotates around the hinge shaft relative to the body. Therefore, the third bendable section 43 may also be referred to as a hinge region. The display screen, to which the flexible display panel belongs, and the body of the electronic device are hinged to each other, and the display apparatus is suitable for an electronic device with a foldable display screen. In addition, since the display apparatus according to the embodiment of the present disclosure includes a plurality of driver ICs 20, more pixels may be controlled by the plurality of driver ICs 20 in the case that the number of pixels corresponding to each driver IC 20 is constant. Therefore, the display apparatus is especially suitable for an electronic device, for example, a notebook (NB) computer, with a large-sized display screen to increase the resolution of the electronic device.

In the embodiment of the present disclosure, each of the first bendable section 41, the second bendable section 42, and the third bendable section 43 is a single-layer structure, which is easy to bend so as to ensure the bendability of the circuit board 40.

Still referring to FIGS. 1 to 3, the circuit board 40 includes a plurality of first flexible printed circuit boards 401, a printed circuit board 402, and a second flexible primed circuit board 403.

Each of the first flexible printed circuit boards 401 is electrically connected to one driver integrated circuit 20, and the first bendable section 41 is at least a portion of the first flexible printed circuit board 401. The printed circuit board 402 is electrically connected to the plurality of first flexible printed circuit boards 401. For example, the printed circuit board 402 is electrically connected to all the first flexible printed circuit boards 401. The printed circuit hoard 402 is disposed on the second surface 104. The second flexible printed circuit board 403 includes one terminal electrically connected to the printed circuit board 402 and the other terminal electrically connected to the logic hoard 30, and each of the second bendable section 42 and the third bendable section 43 is at least a portion of the second flexible printed circuit board 403.

In the embodiment of the present disclosure, the logic board 30 supplies a control signal to the driver ICs 20 through the second flexible printed circuit board 403, the printed circuit board 402, and the first flexible printed circuit boards 401, thereby controlling the flexible display panel 10 to display images. The first bendable section 41 is arranged on the first flexible printed circuit boards 401, that is, the first flexible printed circuit boards 401 are bent to the second surface 104 of the flexible display panel 10. Since the printed circuit board 402 is electrically connected to the first flexible printed circuit boards 401, the printed circuit board 402 is disposed on the second surface 104 of the flexible display panel 10. The printed circuit board 402 is a hard board and is not easy to bend. Since one terminal of the second flexible printed circuit board 403 is electrically connected to the printed circuit board 402, said terminal of the second flexible printed circuit board 403 is also disposed on the second surface 104 of the flexible display panel 10, and the second bendable section 42 is arranged on the second flexible printed circuit board 403 and may be bent to a side of the peripheral region 102 via the second flexible printed circuit hoard 403. Since the other terminal of the second flexible printed circuit hoard 403 is electrically connected to the logic board 30, that is, the logic board 30 is disposed on a side of the peripheral region 102, the logic hoard 30 is not disposed on the flexible display panel 10, which reduces the thickness of the flexible display panel 10. Meanwhile, the width of a non-display region at the first side edge 111 of the flexible display panel 10 is reduced, which reduces the size of the frame of the display apparatus.

Meanwhile, the printed circuit board 402 is arranged in the circuit board 40, and a pitch of a gold finger (conductive contact piece) of the printed circuit board 402 is smaller than that of a gold finger of the flexible printed circuit board, such that the requirement of a hound device can be met, and the printed circuit board can be bound more conveniently, thereby guaranteeing a binding effect. The printed circuit board 402 includes a large number of layers, and the plurality of first flexible printed circuit boards 401 are all electrically connected to the printed circuit board 402. The portions of the circuit hoard 40 that do not need to be folded are arranged as the printed circuit board 402 to facilitate wiring. Meanwhile, the first flexible printed circuit boards 401 and the second flexible printed circuit board 403 are arranged to ensure the bendability of the circuit board 40.

Optionally, in the embodiment of the present disclosure, a total pitch of a golden-linger region of the printed circuit board 402 is ±30 micrometers (μm), which can meet the binding requirement for a bound device.

In the embodiment of the present disclosure, two opposite terminals of each of the first flexible printed circuit boards 401 have pad regions for arranging pads, and the first bendable section 41 is a portion between the two pad regions on the first flexible printed circuit board 401. The two opposite terminals of the second flexible printed circuit board 403 also have pad regions for arranging pads, and the second bendable section 42 and the third bendable section 43 are portions disposed between the two pad regions on the second flexible printed circuit board 403.

As shown in FIGS. 1 and 3, the number of the first flexible printed circuit boards 401 is equal to the that of the driver ICs 20. The first flexible printed circuit boards 401 are electrically connected to the driver ICs 20 in one-to-one correspondence. That is, one first flexible printed circuit board 401 is electrically connected to one driver IC 20. The controller supplies electrical signals to the driver ICs 20 through the first flexible printed circuit boards 401. At this time, the electrical signal on each of the first flexible printed circuit boards 401 is transmitted independently of each other, so as to avoid affecting the transmission of the electrical signals to the plurality of driver ICs 20 due to the damage of one first flexible printed circuit boards 401.

In other embodiments, the number of the first flexible printed circuit boards 401 is less than the number of the driver ICs 20, and one first flexible printed circuit board 401 may be electrically connected to two or more driver ICs 20. The number of bound devices may be reduced in the case that the first flexible printed circuit boards 401 and the driver ICs 20 are bound.

Figure 4:
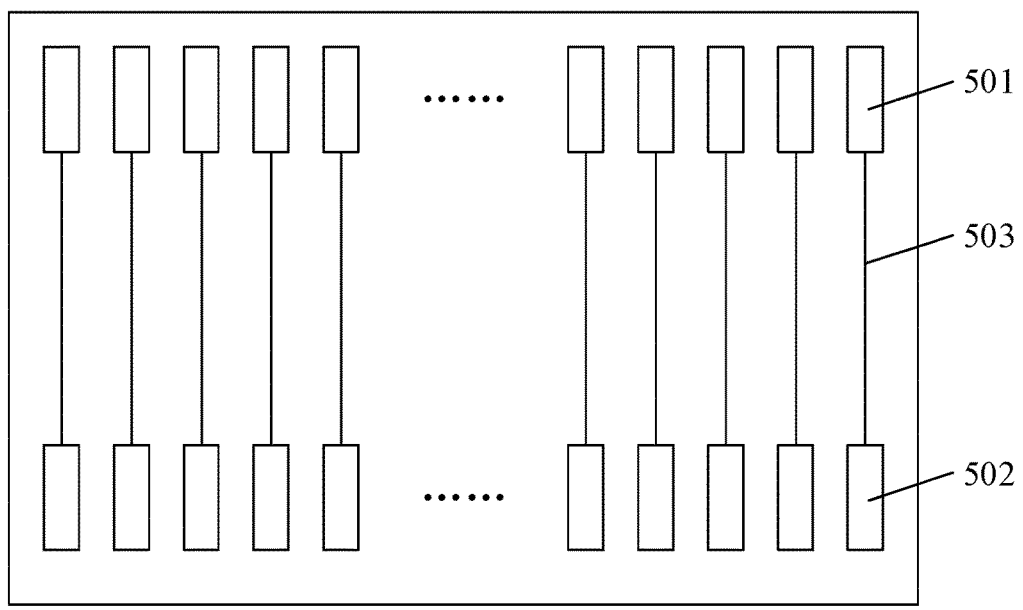
FIG. 4 is a structural view of a first flexible printed circuit board according to an embodiment of the present disclosure.

FIG. 4 is a structural view of a first flexible printed circuit board according to an embodiment of the present disclosure. Referring to FIG. 4, the first flexible printed circuit board 401 is provided with a plurality of pads, which include first pads 501 and second pads 502. The first pads 501 and the second pads 502 are electrically connected via first connection wires 503.

In an example, the first flexible printed circuit board 401 may be a rectangle, and the first pads 501 and the second pads 502 are respectively arranged along two opposite side edges of the rectangle. The first pads 501 are electrically connected to the driver ICs 20, and the second pads 502 are electrically connected to the printed circuit board 402.

Figure 5:
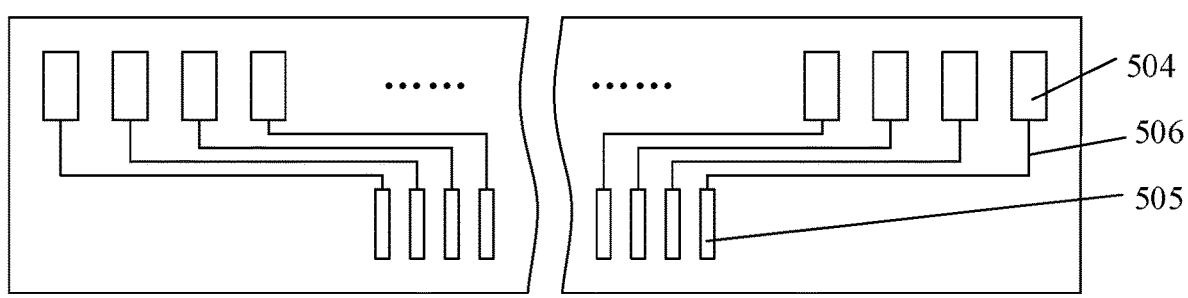
FIG. 5 is a structural view of a printed circuit board according to an embodiment of the present disclosure.

FIG. 5 is a structural view of a printed circuit board according to an embodiment of the present disclosure. Referring to FIG. 5, the printed circuit board 402 is further provided with a plurality of pads, which include third pads 504 and fourth pads 505. The third pads 504 and the fourth pads 505 are connected via second connection wires 506.

In an example, the printed circuit board 402 is elongated, and an extending direction of the printed circuit board 402 is consistent with an extending direction of the first side edge. The third pads 504 are spaced apart along one long side of the printed circuit board 402, and are electrically connected to the second pads 502 in one-to-one correspondence. That is, one third pad 504 is electrically connected to one second pad 502. The fourth pads 505 are arranged in the middle of the other long side of the printed circuit board 402 so as to be electrically connected to the second flexible printed circuit board 403.

Figure 6:
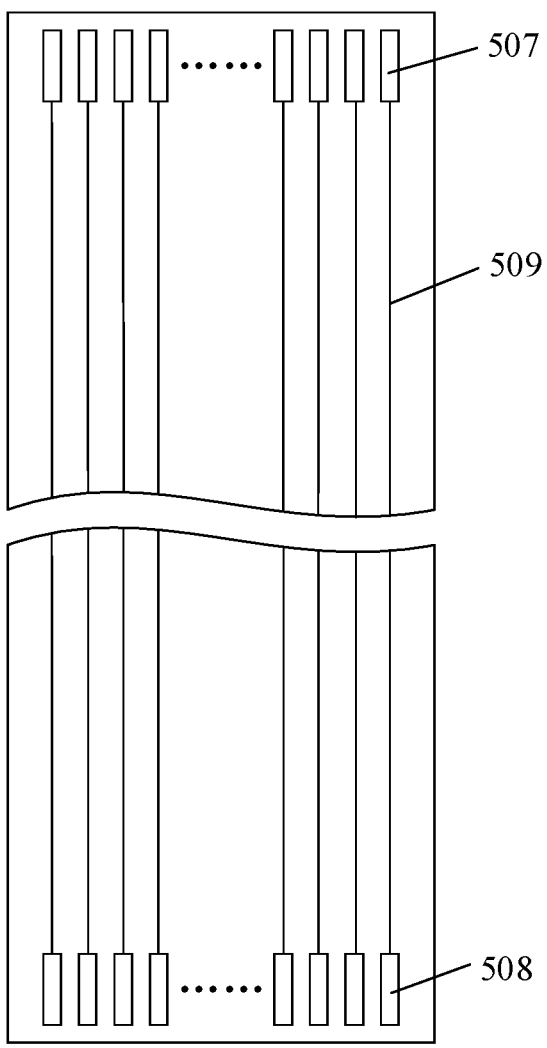
FIG. 6 is a structural view of a second flexible printed circuit board according to an embodiment of the present disclosure.

FIG. 6 is a structural view of a second flexible printed circuit board according to an embodiment of the present disclosure. Referring to FIG. 6, the second flexible printed circuit board 403 is provided with a plurality of pads, which include fifth pads 507 and sixth pads 508. The fifth pads 507 and the sixth pads 508 are electrically connected to each other via third connection wires 509. The fourth pads 505 are electrically connected to the fifth pads 507.

In the embodiment of the present disclosure, the pads may be electrically connected to each other in the form of binding, i.e., by a conductive adhesive.

In the embodiment of the present disclosure, the number of layers of the printed circuit board 402 is between 6 and 10. All the plurality of first flexible printed circuit boards 401 need to be electrically connected to the printed circuit board 402, leading to more wires routed on the printed circuit board 402. With the printed circuit board 402 having many layers, the routed wires may be distributed on different signal layers on the printed circuit board 402, such that the printed circuit hoard 402 can be made smaller, thereby facilitating the miniaturization of the device.

In the embodiment of the present disclosure, a middle region of the second flexible printed circuit board 403 is a single-layer structure. That is, each of the second bendable section 42 and the third bendable section 43 is a single-layer structure, which is convenient to bend.

Figure 7:
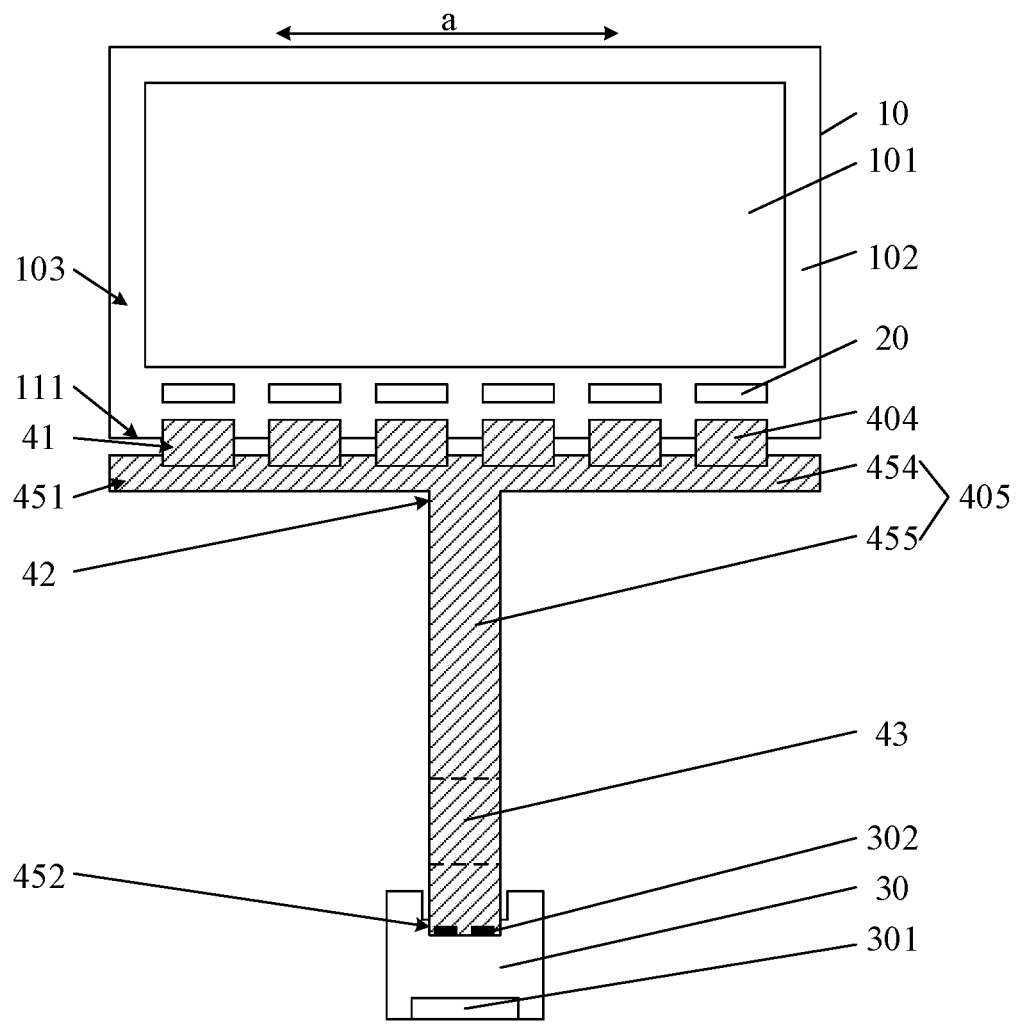
FIG. 7 is a front view of a display apparatus according to an embodiment of the present disclosure.
Figure 8:
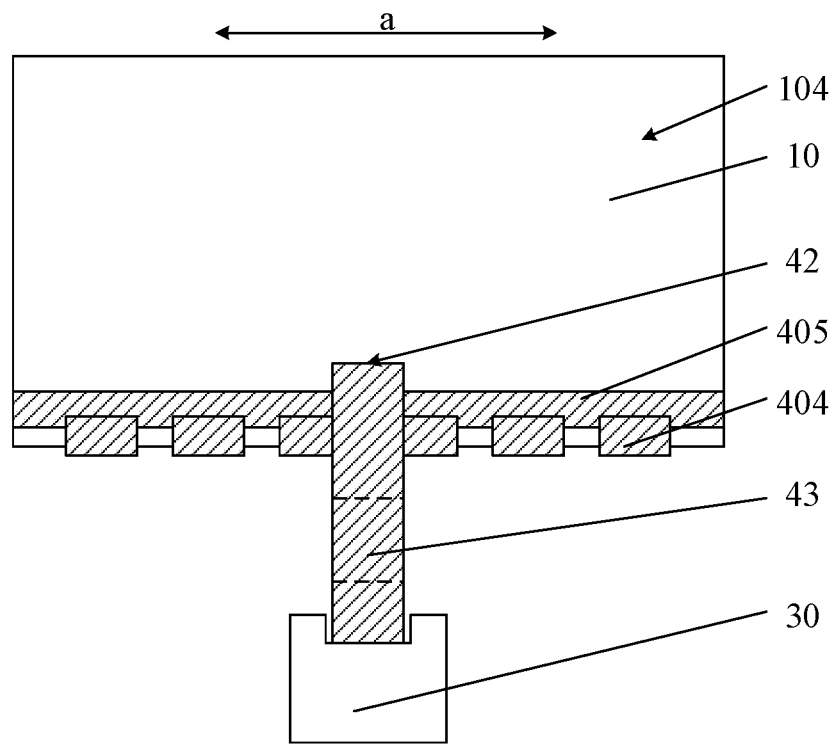
FIG. 8 is a rear view of the display apparatus shown in FIG. 7.

FIG. 7 is a front view of a display apparatus according to an embodiment of the present disclosure. FIG. 8 is a rear view of the display apparatus shown in FIG. 7. Specifically, FIG. 7 is the front view in the case that the circuit board is not bent, and FIG. 8 is the rear view in the case that the circuit board is bent. Referring to FIGS. 7 and 8, the circuit board 40 includes third flexible printed circuit boards 404 and a fourth flexible printed circuit board 405.

Each of the third flexible printed circuit boards 404 is electrically connected to one of the driver integrated circuits 20 and the first bendable section 41 is at least a portion of each of the third flexible printed circuit boards 404. The fourth flexible printed circuit hoard 405 includes a first terminal 451 and a second terminal 452 that are opposite to each other. The first terminal 451 is electrically connected to the third flexible printed circuit boards 404; the second terminal 452 is electrically connected to the logic board 30; and each of the second bendable section 42 and the third bendable section 43 is at least a portion of the fourth flexible printed circuit board 405.

In the embodiment of the present disclosure, the circuit board 40 is arranged in the form of two flexible printed circuit boards. Compared with the form of three circuit boards, the binding needs to be performed only three times, namely the binding between the third flexible printed circuit board 404 and the driver IC 20, the binding between the third flexible printed circuit board 404 and the fourth flexible printed circuit board 405, and the binding between the fourth flexible printed circuit board 405 and the logic board 30, which reduces the number of binding times and increases the efficiency of making the display apparatus.

In the embodiment of the present disclosure, the third flexible printed circuit board 404 and the fourth flexible printed circuit board 405 may be bound together by an anisotropic conductive film (ACF). This binding method may be referred to as FPCB on FPCB (FOF).

The structure and arrangement of the third flexible printed circuit board 404 are the same as those of the first flexible printed circuit board 401, which is not described herein any further.

In the embodiment of the present disclosure, the first bendable section 41 is a portion disposed between the pad regions at two opposite terminals of the third flexible printed circuit board 404. The second bendable section 42 and the third bendable section 43 are portions disposed between the pad regions at two opposite terminals of the fourth flexible printed circuit board 405.

As shown in FIG. 7 the fourth flexible printed circuit board 405 includes a transversal extension portion 454 extending along a direction a in which the driver ICs 20 are arranged, and a longitudinal connection portion 455 perpendicularly connected to the transversal extension portion 454. The transversal extension portion 454 is electrically connected to the six third flexible printed circuit boards 404 and the longitudinal connection portion 455 is electrically connected to the logic board 30.

In the embodiment of the present disclosure, the fourth flexible printed circuit board 405 is arranged as a "T"-shaped flexible printed circuit board; the transversal extension portion 454 is electrically connected to the third flexible printed circuit boards 404; and the longitudinal connection portion 455 is electrically connected to the logic board 30. That is, the binding needs to be performed only three times, namely the binding between the driver IC 20 and the third flexible printed circuit board 404, the binding between the third flexible printed circuit board 404 and the transversal extension portion 454, and the binding between the longitudinal connection portion 455 and the logic, board 30, which can reduce the number of binding times and increase the working efficiency.

The arrangement of the transversal extension portion 454 is the same as that of the printed circuit board 402 in FIG. 1, and the arrangement of the longitudinal connection portion 455 is the same as that of the second flexible printed circuit board 403 in FIG. 1, except that the transversal extension portion 454 in FIG. 7 and the longitudinal connection portion 455 are both flexible printed circuit boards, and may be made by integral molding.

It should be noted that, as shown in FIG. 7, one third flexible printed circuit board 404 is electrically connected to one driver IC 20. In other embodiments, one third flexible printed circuit board 404 may be electrically connected to two or more driver ICs 20, which is not limited in the present disclosure.

Figure 9:
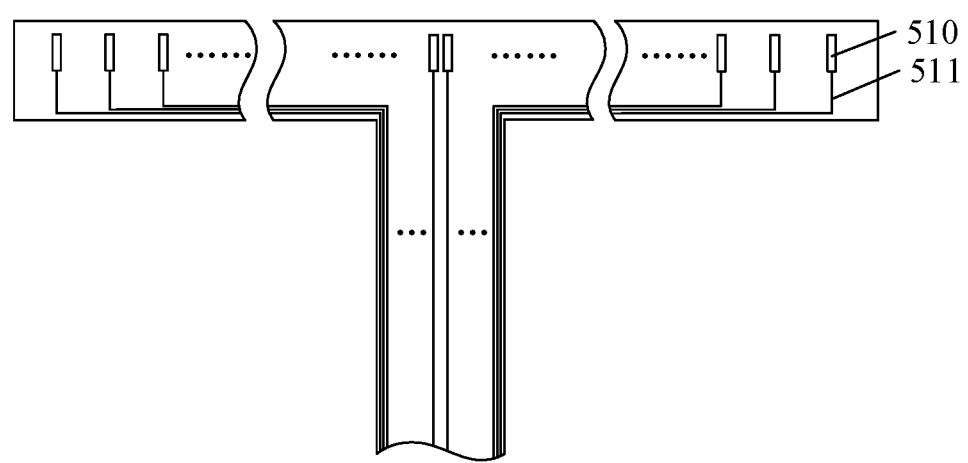
FIG. 9 is a schematic structural view of a third flexible printed circuit board according to an embodiment of the present disclosure.

FIG. 9 is a schematic structural view of a third flexible printed circuit board according to an embodiment of the present disclosure. Referring to FIG. 9, each of the third flexible printed circuit boards 404 is provided with a plurality of pads, which include seventh pads 510 and eighth pads (not shown). The seventh pads 510 are electrically connected to the second pads 502, the eighth pads are electrically connected to the logic board 30, and the seventh pads 510 are electrically connected to the eighth pads through fourth connection wires 511.

In the embodiment of the present disclosure, the middle region of each of the third flexible printed circuit boards 404 is a single-layer circuit board structure, so as to facilitate the bending of the third flexible printed circuit board 404.

Figure 10:
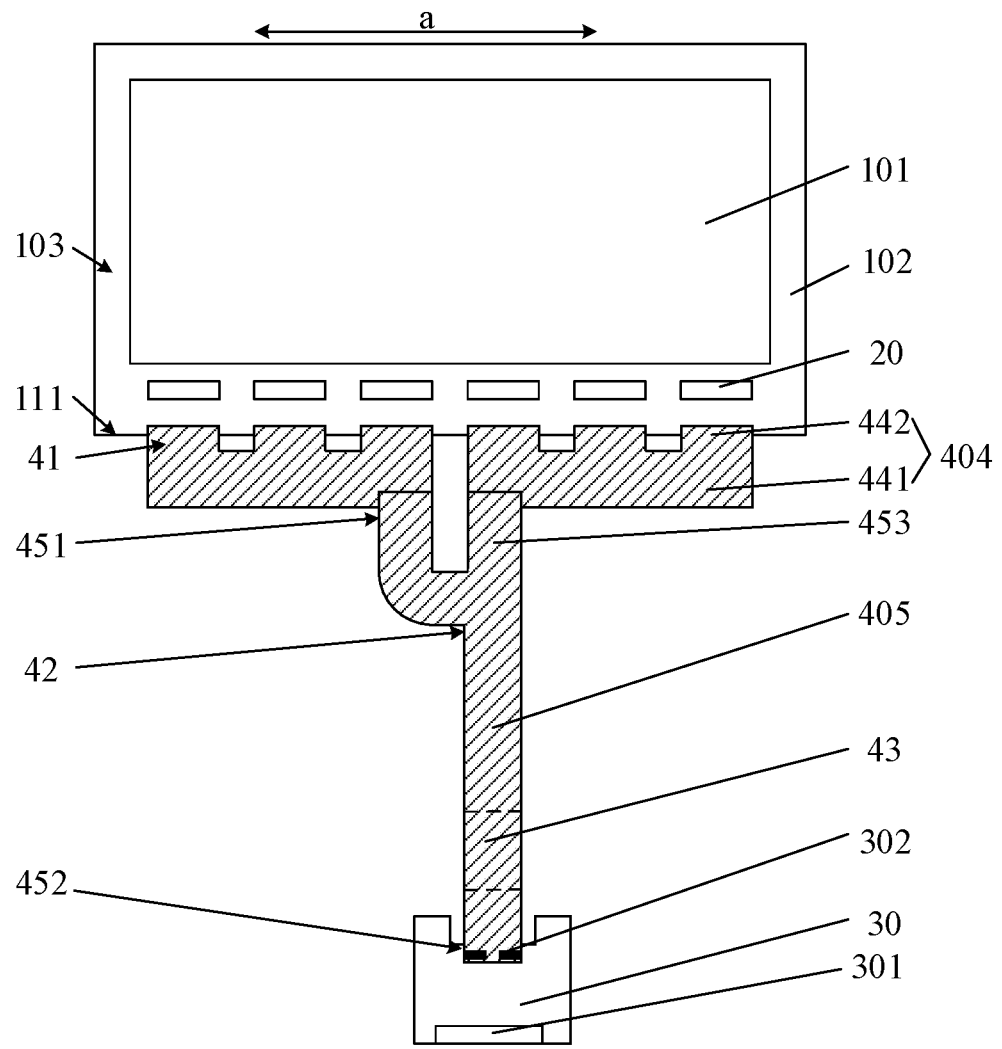
FIG. 10 is a front view of a display apparatus according to an embodiment of the present disclosure.
Figure 11:
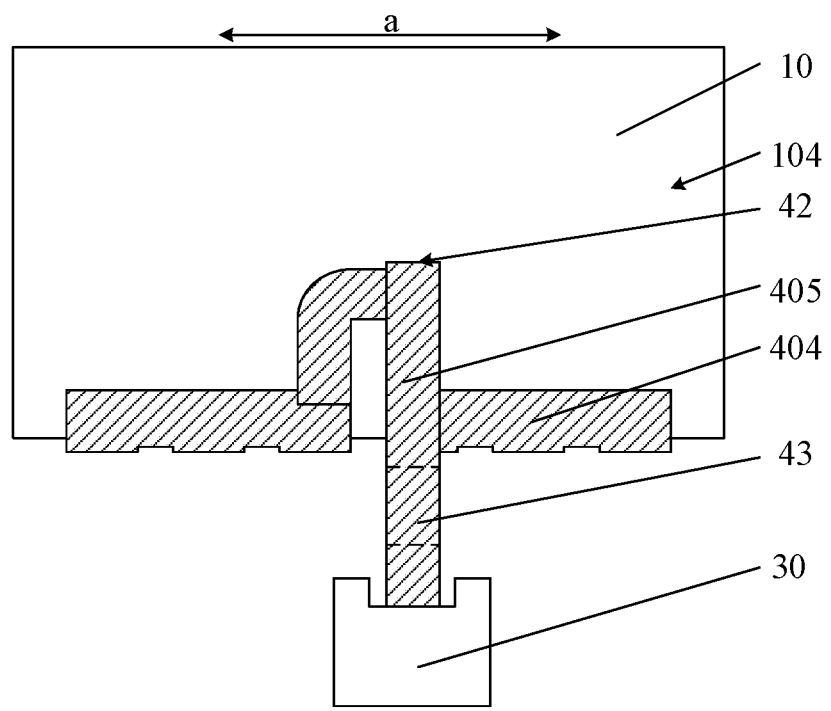
FIG. 11 is a rear view of the display apparatus shown in FIG. 10.

FIG. 10 is a front view of a display apparatus according to an embodiment of the present disclosure, FIG. 11 is a rear view of the display apparatus shown in FIG. 10, with FIG. 10 being the front view where the circuit board is not bent, and FIG. 11 being the rear view after the circuit board is bent. Referring to FIGS. 10 and 11, the third flexible printed circuit board 404 includes a main body 441 and at least two first branches 442 connected to the main body 441, and each of the first branches 442 is electrically connected to one driver IC 20 correspondingly. A first terminal 451 of the fourth flexible printed circuit board 405 includes at least two second branches 453 each of which is electrically connected to the main body 441 of one third flexible printed circuit board 404, respectively.

In the embodiment of the present disclosure, one third flexible printed circuit board 404 includes at least two first branches 442, that is, one third flexible printed circuit board 404 is electrically connected to at least two driver ICs 20, which can reduce the number of the third flexible printed circuit boards 404. In the case that the driver IC 20 is bound to the third flexible printed circuit board 404, the number of bound devices is equal to the that of the third flexible printed circuit boards 404. Therefore, in the case that a plurality of driver ICs 20 are electrically connected to one third flexible printed circuit board 404, the number of bound devices is reduced as compared to compared to the case that one driver IC 20 is electrically connected to one third flexible printed circuit board 404.

The function of the third flexible printed circuit board 404 shown in FIG. 10 is the same as that of the third flexible printed circuit board 404 and the first flexible printed circuit board 401, and both are for the electric connection to the driver IC 20. The difference lies in that the third flexible printed circuit board 404 in FIG. 10 is made from a plurality of flexible printed circuit boards, and is electrically connected to different driver ICs 20 through the first branches 442.

The third flexible printed circuit board 404 shown in FIG. 10 is an entirety. That is, the main body 441 and the first branches 442 are integrally formed, and both the main body 441 and the first branches 442 are flexible printed circuit boards and are bendable.

The display panel shown in FIG. 10 includes two third flexible printed circuit boards 404. One of the third flexible printed circuit boards 404 includes three first branches 442, that is, the third flexible printed circuit board 404 is of a trident shape. The first terminal 451 of the fourth flexible printed circuit board 405 includes two second branches 453, that is, the fourth flexible printed circuit board 405 is of a "Y" shape. The two second branches 453 are electrically connected to the two third flexible printed circuit boards 404, respectively.

Figure 12:
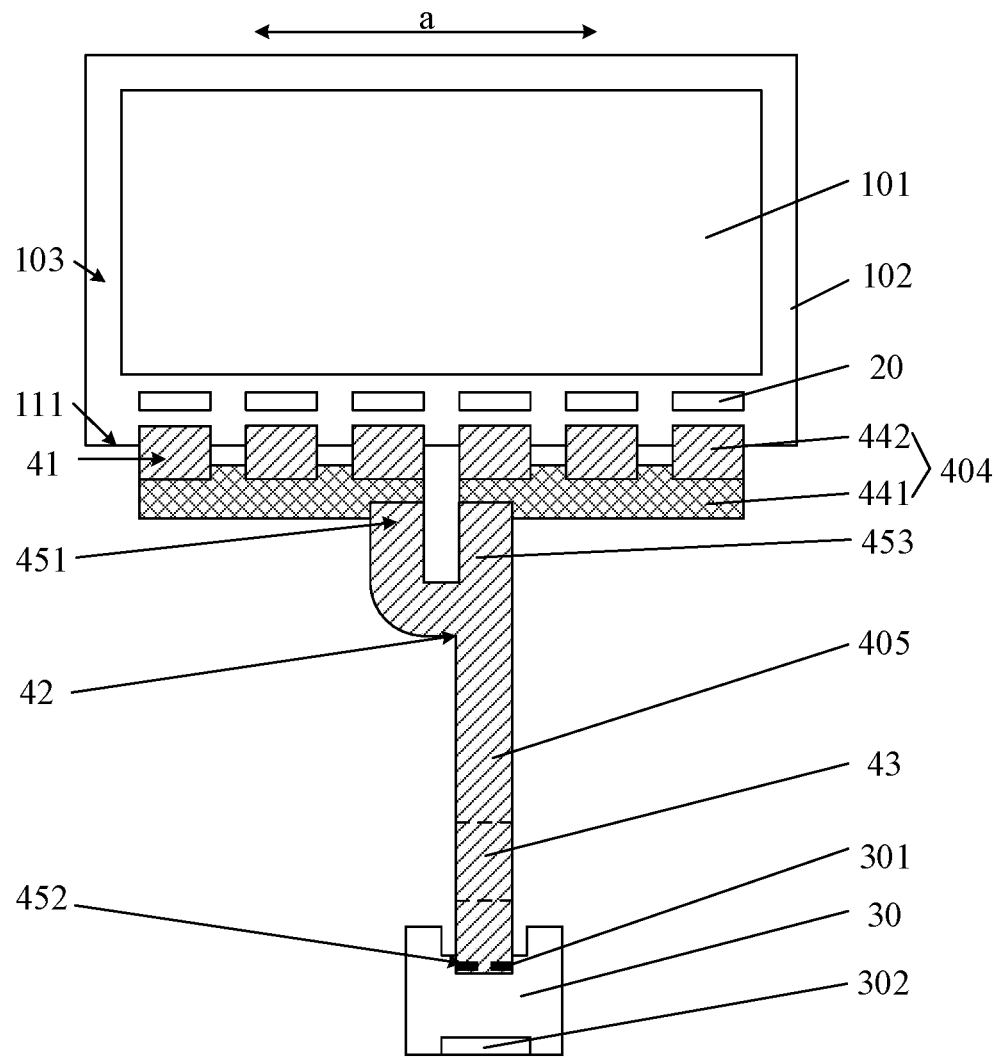
FIG. 12 is a front view of a display apparatus according to an embodiment of the present disclosure.
Figure 13:
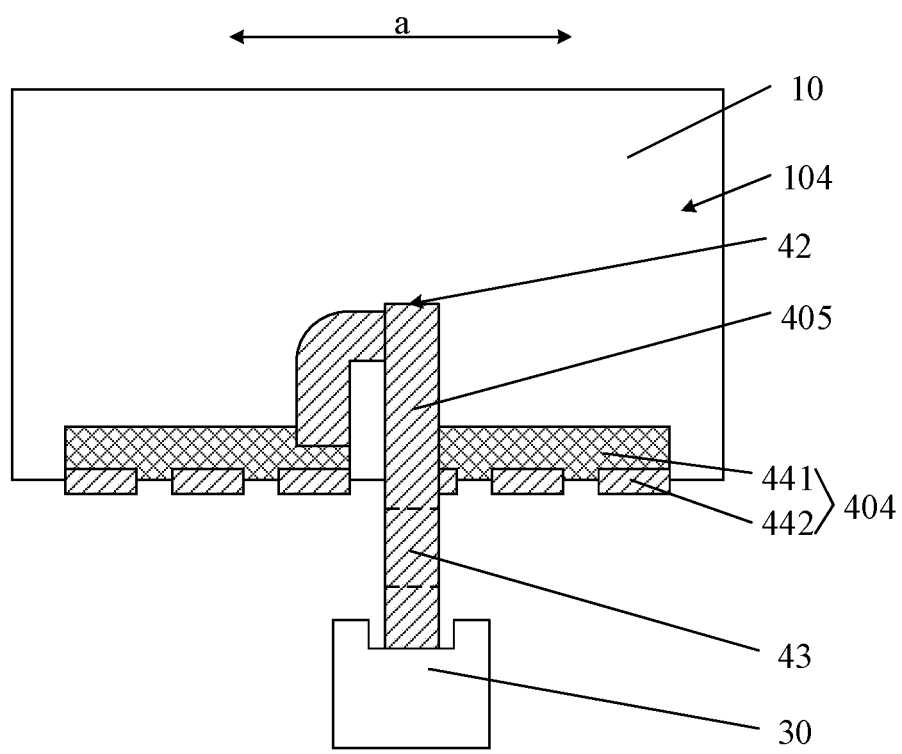
FIG. 13 is a rear view of the display apparatus shown in FIG. 12.

FIG. 12 is a front view of a display apparatus according to an embodiment of the present disclosure. FIG. 13 is a rear view of the display apparatus shown in FIG. 12, with FIG. 12 being the front view where the circuit board is not bent, and FIG. 13 being the rear view after the circuit board is bent. Referring to FIGS. 12 and 13, the main body 441 of the third flexible printed circuit board 404 is a printed circuit board, and the first branch 442 is a flexible printed circuit board, which guarantees the bendability of the third flexible printed circuit board 404. Moreover, the main body 441 is the printed circuit board with the golden fingers having a large pitch, such that the circuit boards are more convenient to bind, thereby guaranteeing the binding effect.

Since one fourth flexible printed circuit board 405 needs to be electrically connected to a plurality of third flexible printed circuit boards 404, the second branches 453 are arranged on the first terminal 451 of the fourth flexible printed circuit board 405, which is then electrically connected to the third flexible printed circuit boards 404 via the second branches 453.

Figure 14:
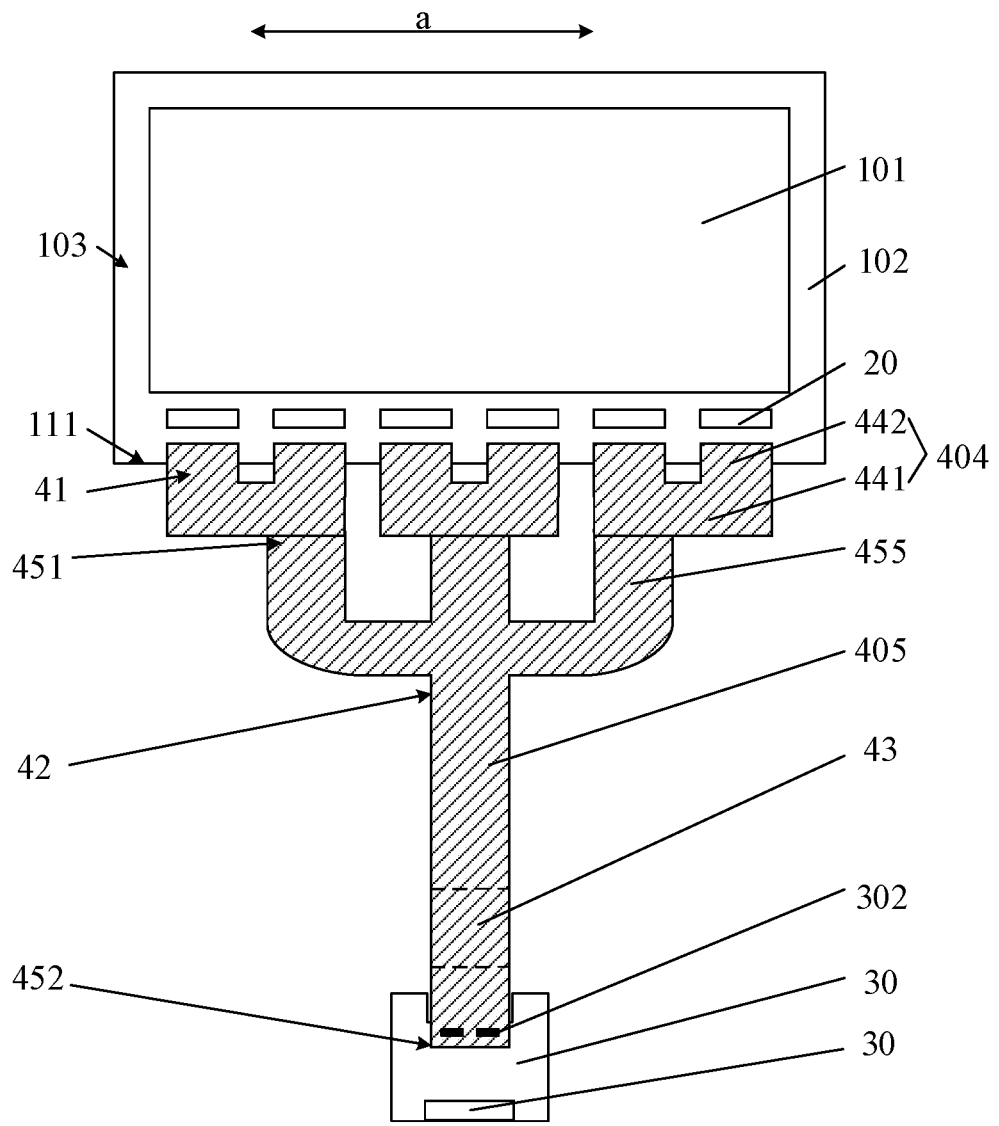
FIG. 14 is a front view of a display apparatus according to an embodiment of the present disclosure.
Figure 15:
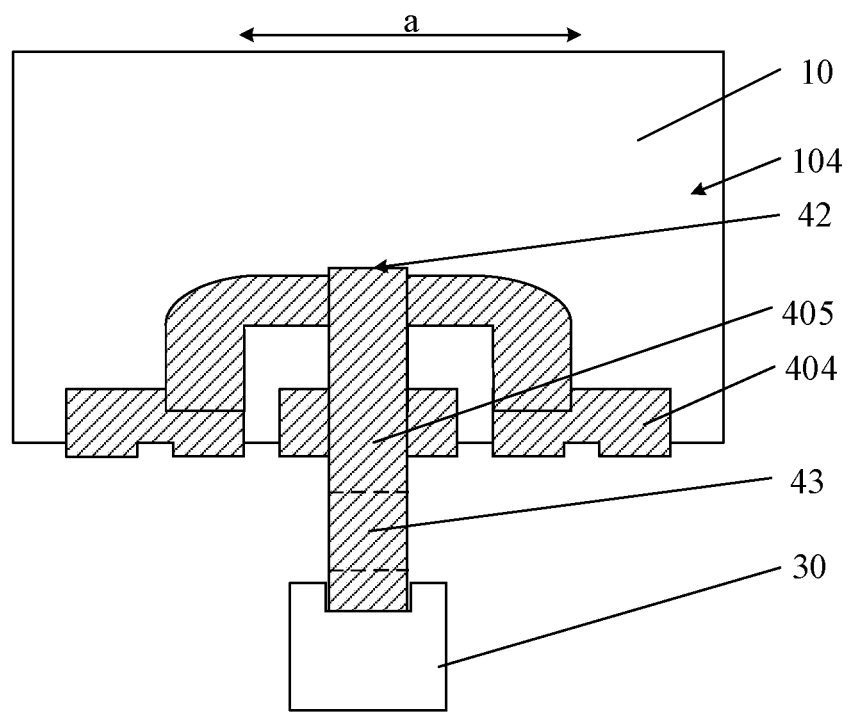
FIG. 15 is a rear view of the display apparatus shown in FIG. 14.

FIG. 14 is a top view of a display apparatus according to an embodiment of the present disclosure. FIG. 15 is a rear view of the display apparatus shown in FIG. 14, with FIG. 14 being the front view where the circuit board is not bent, and FIG. 15 being the rear view after the circuit board is bent. Referring to FIGS. 14 and 15, the display panel includes three third flexible printed circuit boards 404. One of the third flexible printed circuit boards 404 includes two first branches 4. The first terminal 451 of the fourth flexible printed circuit board 405 includes three second branches 453. Then, the three second branches 453 are electrically connected to the three third flexible printed circuit boards 404, respectively.

Figure 16:
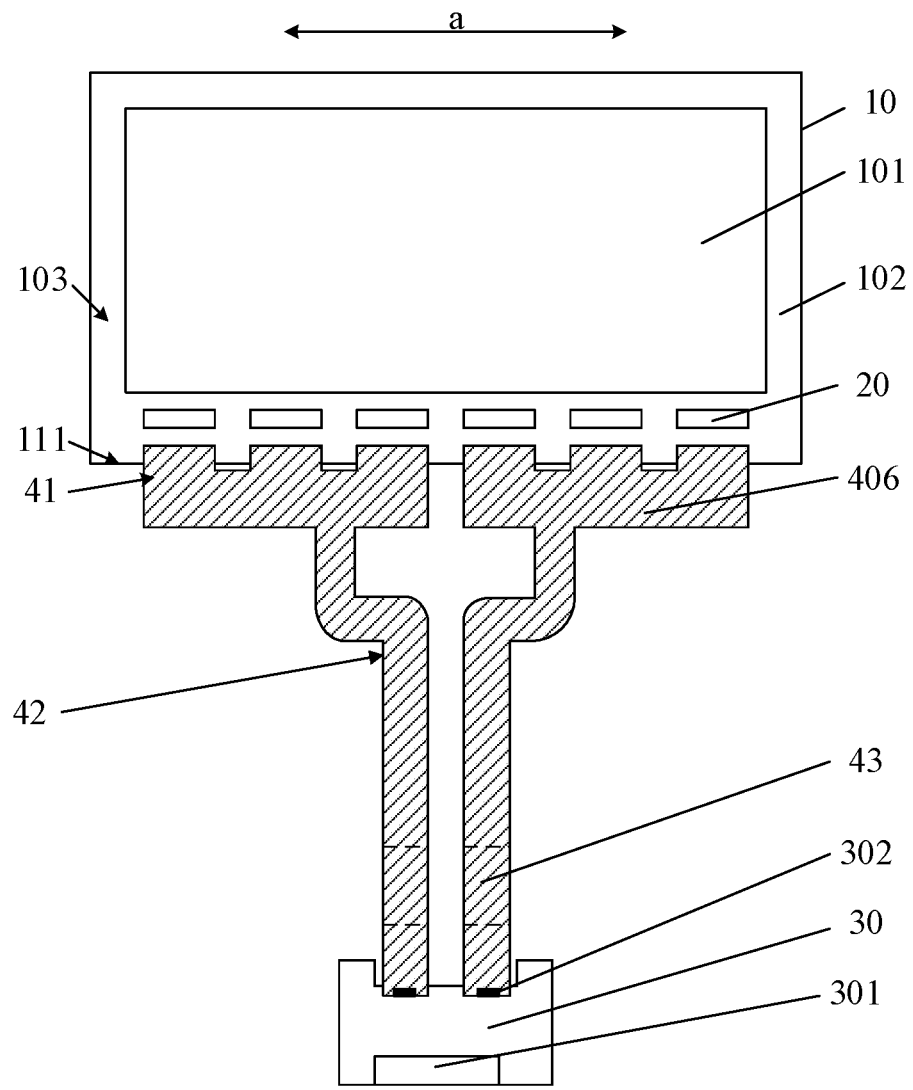
FIG. 16 is a front view of a display apparatus according to an embodiment of the present disclosure.
Figure 17:
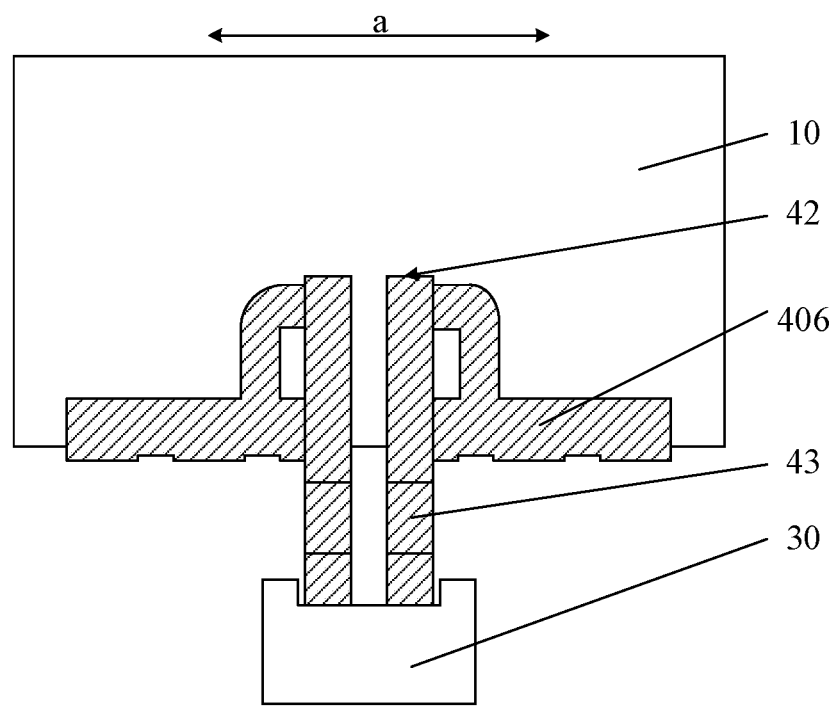
FIG. 17 is a rear view of the display apparatus shown in FIG. 16.

FIG. 16 is a front view of a display apparatus according to an embodiment of the present disclosure. FIG. 17 is a rear view of the display apparatus shown in FIG. 16, with FIG. 16 being the front view where the circuit board is not bent, and FIG. 17 being the rear view after the circuit board is bent. Referring to FIGS. 16 and 17, the circuit board 40 includes two fifth flexible printed circuit boards 406, each of which includes one terminal electrically connected to three driver ICs 20, and the other terminal electrically connected to the logic board 30.

In the embodiment of the present disclosure, the circuit board 40 is directly arranged as an integral fifth flexible printed circuit board 406, and the driver ICs 20 are electrically connected to the logic board 30 via the fifth flexible printed circuit board 406, such that binding only needs to be performed on both terminals of the fifth flexible printed circuit board 406, which reduces the number of binding times while ensuring the bendability of the circuit board 40.

The display apparatuses shown in FIGS. 16 and 17 are different from the above-mentioned display apparatus in that the circuit board is provided as an entirely in each of FIGS. 16 and 17.

In the display apparatuses shown in FIGS. 16 and 17, the circuit board 40 includes two fifth flexible printed circuit boards 406 and the logic board 30 includes two first connectors 302. One terminal of each of the fifth flexible printed circuit boards 406 is electrically connected to three driver ICs 20, and the other terminal of the fifth flexible printed circuit board 406 is electrically connected to the corresponding first connector 302.

In the embodiment of the present disclosure, two fifth flexible printed circuit boards 406 are arranged in the display apparatus. In one aspect, this achieves the above-mentioned effect of reducing the number of binding times and ensure the bendability of the circuit board; and in another aspect, this reduces the number of the fifth flexible printed circuit boards 406, thereby reducing the number of bound devices as compared to the case of arranging a plurality of fifth flexible printed circuit boards 406.

In other embodiments, a plurality of fifth flexible printed circuit boards 406 may be arranged in the display apparatus. In this case, a plurality of first connectors 302 need to be arranged on the logic board 30, and the first connectors 302 are electrically connected to the fifth flexible printed circuit boards 406 in one-to-one correspondence. That is, one first connector 302 is electrically connected to one fifth flexible printed circuit board 406.

Figure 18:
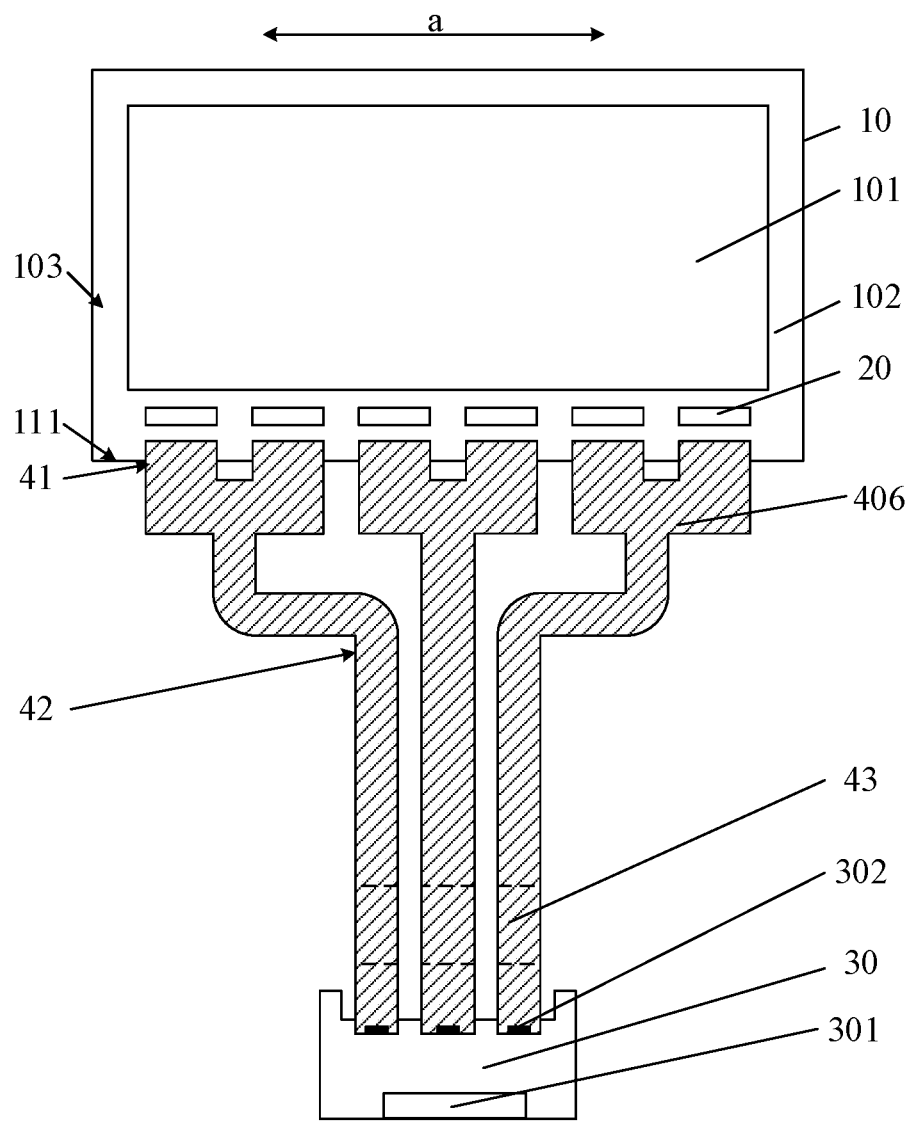
FIG. 18 is a front view of a display apparatus according to an embodiment of the present disclosure.
Figure 19:
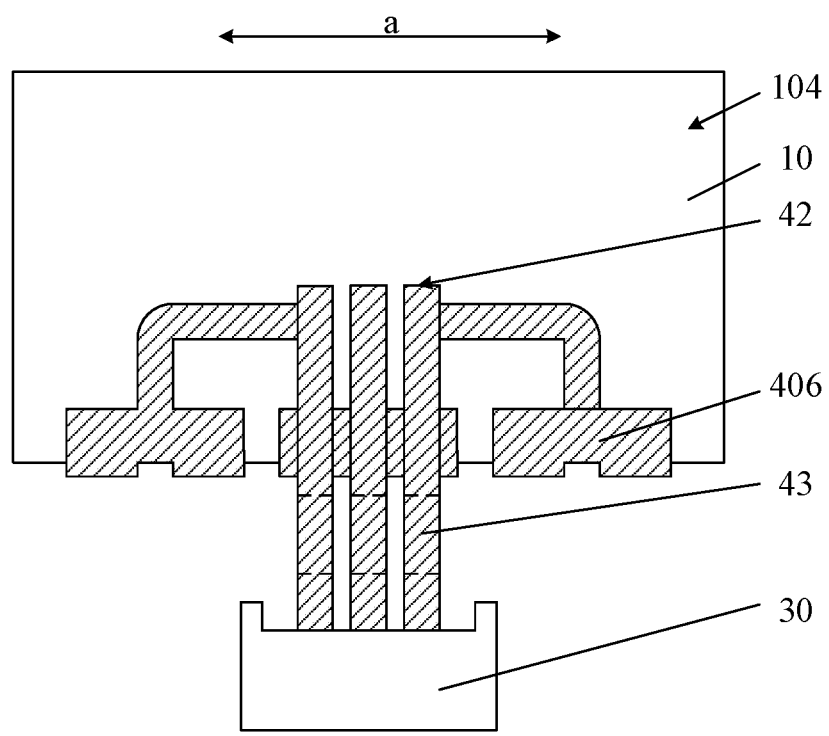
FIG. 19 is a rear view of the display apparatus shown in FIG. 18.

FIG. 18 is a front view of a display apparatus according to an embodiment of the present disclosure, FIG. 19 is a rear view of the display apparatus shown in FIG. 18, with FIG. 18 being the front view where the circuit board is not bent, and FIG. 19 being the rear view after the circuit board is bent. Referring to FIGS. 18 and 19, three fifth flexible printed circuit boards 406 are arranged in the display apparatus; one fifth flexible printed circuit board 406 is electrically connected to two driver ICs 20; and the logic board 30 includes three first connectors 302.

In other embodiments, the number of fifth flexible printed circuit boards 406 and the number of first connectors 302 may also be defined according to actual needs, which are not limited in the present disclosure.

In the embodiment of the present disclosure, the arrangement of the pads in the third, fourth, and fifth flexible printed circuit boards 404, 405, 406 is consistent with that of the pads in the first flexible printed circuit board 401, which will not be repeated here.

It should be noted that, in the embodiments shown in FIG. 1 to FIG. 14, the circuit board 40 is electrically connected to the logic board via the pads. Alternatively, the circuit board 40 may be electrically connected to the logic board via connectors. The structure of the circuit board 40, which is electrically connected to the logic board via the connector, will be exemplarily described below with reference to FIG. 20.

Figure 20:
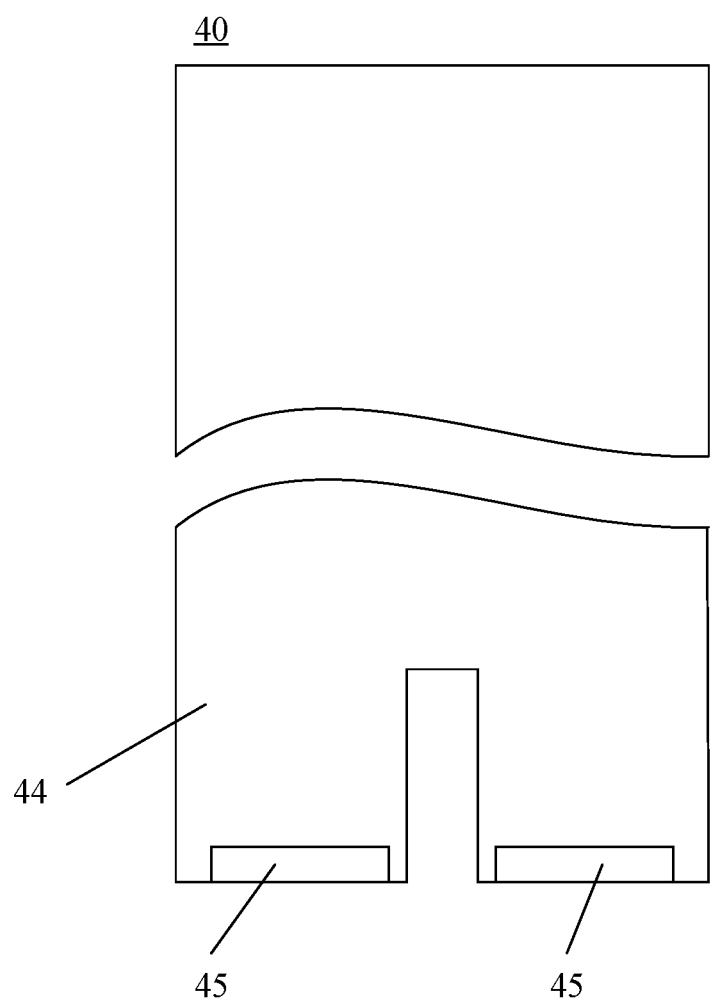
FIG. 20 is a structural view of a circuit board according to an embodiment of the present disclosure.

FIG. 20 is a structural view of a circuit board according to an embodiment of the present disclosure. Referring to FIG. 20, the other terminal of the circuit board 40 includes two third branches 44. The logic board 30 includes two first connectors 302. Each of the third branches 44 includes one second connector 45, and the first connector 302 and the second connector 45 are electrically connected in one-to-one correspondence. That is, one first connector 302 and one second connector 45 are electrically connected. That is, the circuit board 40 is electrically connected to the logic board 30 via the connectors.

In the embodiment of the present disclosure, the circuit board 40 and the logic board 30 are electrically connected via the second connectors 45 and the first connectors 302. That is, the circuit board 40 and the logic board 30 are electrically connected by plugging. The logic board 30 when damaged is easy to disassemble, without the need of changing the whole panel, thereby saving resources.

Moreover, in this embodiment, third branches 44 are arranged on the second terminal of the circuit board 40. Since the second terminal of the circuit board 40 is flexible and bendable, the plurality of third branches 44 may be moved with respect to each other, such that the electric connection between the second connectors 45 and the first connectors 302 is facilitated. For example, the second connector 45 on one third branch 44 is first electrically connected to one first connector 302, and the remaining third branches 44 may not correspond to other first connectors 302. In this case, the third branches 44 may be slightly moved to an extent that the second connectors 45 on the third branches 44 can be electrically connected to the first connectors 302.

Optionally, the circuit board 40 is a double-layer circuit board structure in a region where the second connectors 45 are disposed. Since an arrangement order of the signal lines on the flexible display panel is usually inconsistent with the arrangement order of the signal lines on the processor, it is necessary to adjust the arrangement order of the signal lines on the circuit board 40. By providing the region, where the second connectors 45 are disposed, as the double-layer circuit board structure, the sequence of the signal lines can be adjusted by using another conductive pattern layer.

Optionally, in order to ensure the connection strength between the circuit board and the logic board, a reinforcing board may also be disposed in the region where the second connectors 45 are disposed. The reinforcing board and the second connectors 45 are disposed on two opposite side surfaces of the circuit board.

Figure 21:
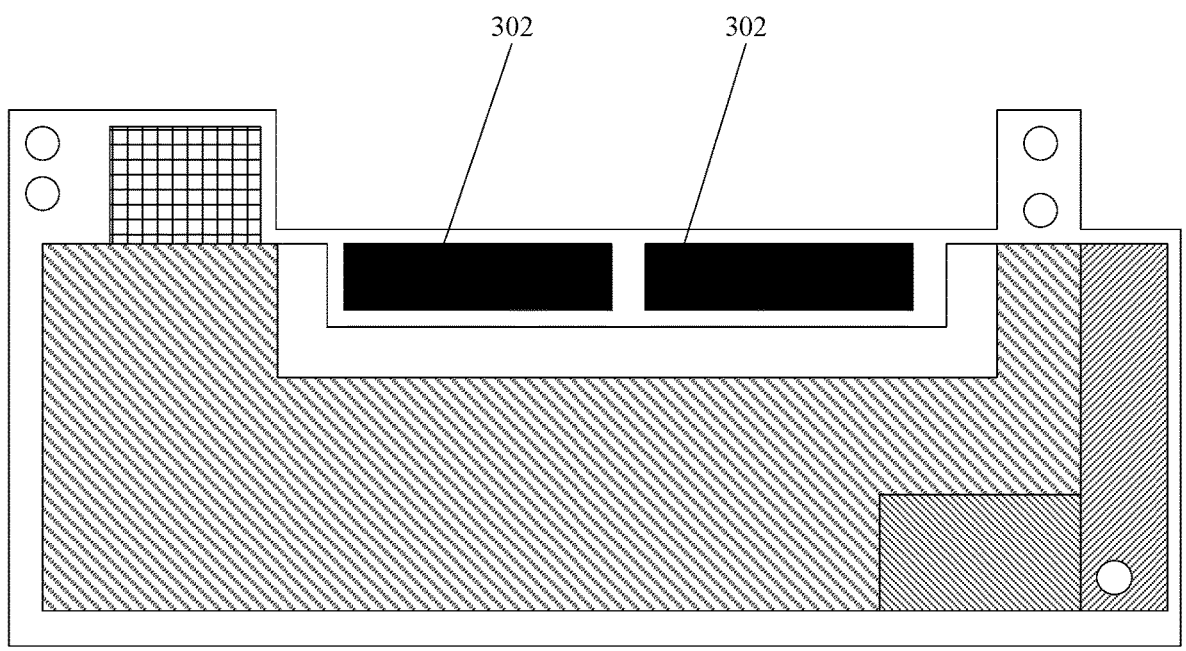
FIG. 21 is a top view of a logic board according to an embodiment of the present disclosure.

FIG. 21 is a top view of a logic board according to an embodiment of the present disclosure. Referring to FIG. 21, the logic board 30 includes a carrier circuit board and a plurality of electronic components. The carrier circuit board includes two opposite carrying surfaces; and the plurality of electronic components are disposed on the two carrying surfaces, respectively. The interface is also disposed on the carrier surface of the carrier circuit board.

The electronic components include, but are not limited to, a T-CON IC, a power management integrated circuit (PMIC) chip, a flash chip, a level shifter unit, a capacitor, a resistor, and other components.

Herein, the T-CON IC is configured to generate timing signals required by a source driver IC (for example, the driver IC 20) and a gate driver circuit; and to convert an input signal received from the processor into a data signal acceptable by the source driver IC. The T-CON IC may be embedded with a variety of basic image processing algorithms, for example, frame rate control (FRC), over drive, color engine, Demura Deburn-In and the like. The PMIC chip is configured to supply voltage signals and/or current signals to other chips and the flexible display panel. The flash chip is configured to store image processing algorithms, for example, gamma correction, Demura and other algorithms. The level shifter unit is configured to perform level shifting based on the timing signal generated by the T-CON IC, and to generate and supply signals such as high-level gate (VGH) signals and low-level gate (VGL) signals to the gate driver IC, which outputs signals to the gate lines under the control of the signals output by the level sifter unit.

Optionally, at least one carrying surface of the logic board is divided into a plurality of mounting regions, each of which is configured for mounting of components at different heights. In a possible embodiment, components mounted on one carrying surface of the logic board have the same height, and the other carrying surface is divided into a plurality of mounting regions. For example, different shade lines in FIG. 21 represent different mounting regions. In this way, an internal space of the electronic device occupied by the logic board is saved.

In the embodiment of the present disclosure, the logic board 30 further includes mounting holes, via which the logic board 30 is mounted on a host machine.

In all embodiment of the present disclosure, the number of layers of the logic board 30 is between 8 and 10. In the embodiment of the present disclosure, the logic board 30 is arranged on the host machine and includes a limited area, but the number of electronic components is large. Therefore, the number of layers of the logic board 30 is increased to meet the requirement for routing wires for the electronic components on the logic board 30.

The embodiment of the present disclosure further provides an electronic device. The electronic device includes a display screen and a body. The display screen and the body are hinged by a hinge shaft; the body includes a processor therein; the display screen includes the display apparatus shown as in any one of the above figures; and the processor is electrically connected to the interface of the logic board.

In an embodiment of the present disclosure, the electronic device includes a notebook computer, a camera and the like.

Figure 22:
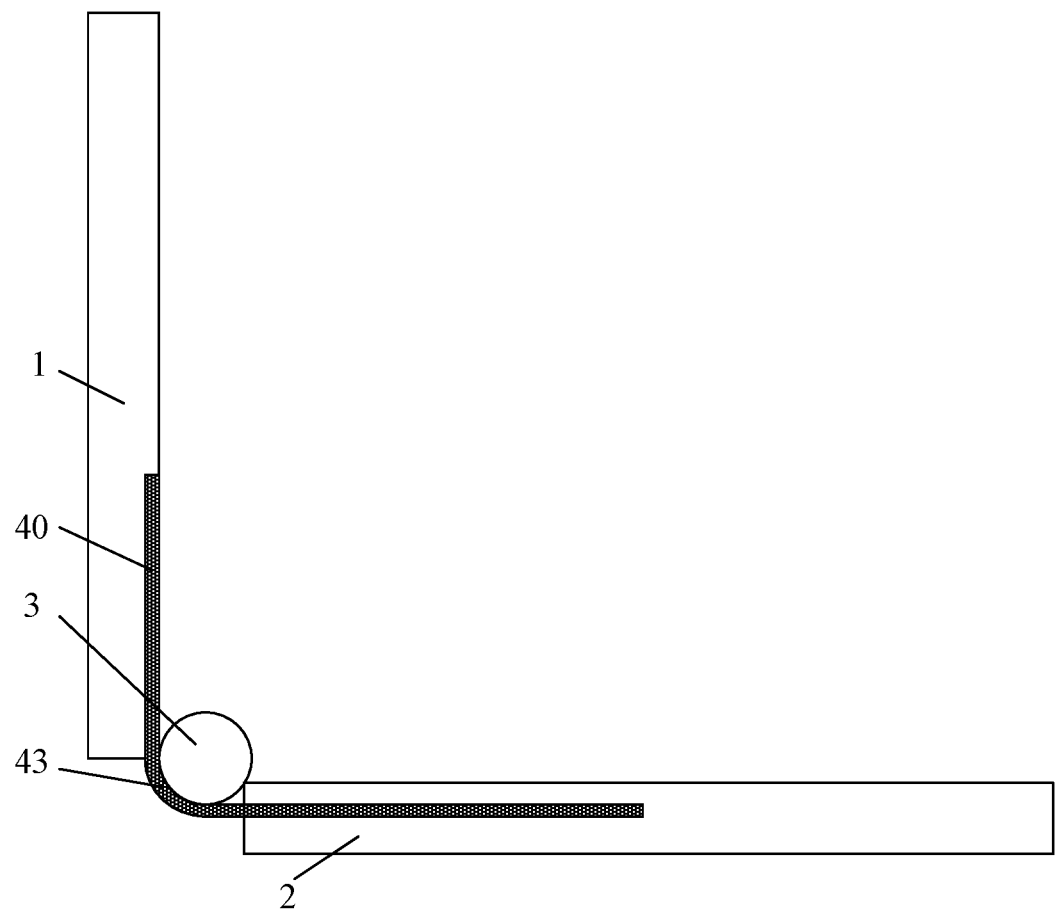
FIG. 22 is a schematic structural view of a notebook computer according to an embodiment of the present disclosure.
Figure 23:
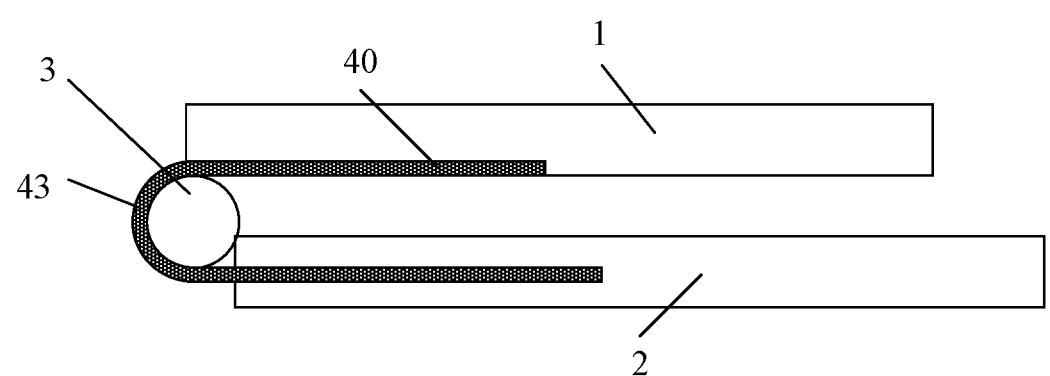
FIG. 23 is a schematic structural view of a notebook computer according to an embodiment of the present disclosure.

FIGS. 22 and 23 are schematic structural views of a notebook computer according to an embodiment of the present disclosure. FIG. 22 is a schematic view of an opened notebook computer and FIG. 23 is a schematic view of a closed notebook computer. Referring to FIGS. 22 and 23, a display screen 1 of the notebook computer is hinged with its host machine 2 via a hinge shaft 3; a circuit board 40 is electrically connected to the flexible display panel (not shown) in the display screen 1 and the host machine and a third bendable section 43 fits on the hinge shaft 3. When the hinge shaft 3 rotates, the third bendable section 43 moves by fitting an outer peripheral wall of the hinge shaft 3.

Described above are merely optional embodiments of the present disclosure, but are not intended to limit the present disclosure. Any modifications, equivalent replacements, improvements and the like made within the spirit and principles of the present disclosure should be included within the scope of protection of the present disclosure.

What is claimed is:

1. A display apparatus, comprising:
   a flexible display panel comprising a display region and a peripheral region surrounding the display region;
   a plurality of driver integrated circuits disposed on a first surface of the flexible display panel and on the peripheral region, wherein the plurality of driver integrated circuits are spaced apart along a first side edge of the flexible display;
   a logic board comprising an interface configured to be electrically connected to a processor of an electronic device; and
   a circuit board connected between the flexible display panel and the logic board, wherein the circuit board is electrically connected to the driver integrated circuits and the logic board;
   wherein the circuit board comprises a first bendable section, a second bendable section, and a third bendable section; wherein the first bendable section is configured to be bent to a second surface of the flexible display panel along the first side edge, the second surface and the first surface being two opposite surfaces of the flexible display panel; the second bendable section is configured to be bent at a side where the second surface is disposed, such that the logic board protrudes from the first side edge; and the third bendable section is configured to bypass a hinge shaft of the electronic device;
   wherein the circuit board comprises:
   at least one first flexible printed circuit board electrically connected to at least one of the driver integrated circuits, wherein the first bendable section is at least a portion of the first flexible printed circuit board;
   a printed circuit board electrically connected to the at least one first flexible printed circuit board, wherein the printed circuit board is disposed on the second surface; and
   a second flexible printed circuit board comprising one terminal electrically connected to the printed circuit board and the other terminal electrically connected to the logic board, wherein the second bendable section and the third bendable section are each at least a portion of the second flexible printed circuit board.

2. The display apparatus according to claim 1, wherein the at least one first flexible printed circuit board and the driver integrated circuits are electrically connected one-to-one correspondence.

3. The display apparatus according to claim 1, wherein the circuit board comprises:
   at least two fifth flexible printed circuit boards, wherein each of the fifth flexible printed circuit boards comprises one terminal electrically connected to at least two of the driver integrated circuits, and the other terminal electrically connected to the logic board.

4. The display apparatus according to claim 1, wherein the logic board comprises at least two first connectors; and
the circuit board comprises at least two third branches at one terminal thereof, wherein each of the third branches comprises one second connector, and the first connectors are electrically connected to the second connectors in one-to-one correspondence.

5. The display apparatus according to claim 1, wherein each of the first bendable section, the second bendable section and the third bendable section is a single-layer structure.

6. The display apparatus according to claim 1, wherein a quantity of the driver integrated circuits is between 4 and 10.

7. The display apparatus according to claim 1, wherein the logic board comprises a carrier circuit board and a plurality of electronic components, wherein the carrier circuit board comprises two opposite carrying surfaces, and the plurality of electronic components are disposed on the two carrying surfaces.

8. A display apparatus, comprising:
a flexible display panel comprising a display region and a peripheral region surrounding the display region;
a plurality of driver integrated circuits disposed on a first surface of the flexible display panel and on the peripheral region, wherein the plurality of driver integrated circuits are spaced apart along a first side edge of the flexible display;
a logic board comprising an interface configured to be electrically connected to a processor of an electronic device; and
a circuit board connected between the flexible display panel and the logic board, wherein the circuit board is electrically connected to the driver integrated circuits and the logic board;
wherein the circuit board comprises a first bendable section, a second bendable section, and a third bendable section; wherein the first bendable section is configured to be bent to a second surface of the flexible display panel along the first side edge, the second surface and the first surface being two opposite surfaces of the flexible display panel; the second bendable section is configured to be bent at a side where the second surface is disposed, such that the logic board protrudes from the first side edge; and the third bendable section is configured to bypass a hinge shaft of the electronic device;
wherein the circuit board comprises:
third flexible printed circuit boards electrically connected to at least one of the driver integrated circuits, wherein the first bendable section is at least a portion of each of the third flexible printed circuit board; and
a fourth flexible printed circuit board comprising a first terminal and a second terminal that are opposite to each other, wherein the first terminal is electrically connected to at least two of the third flexible printed circuit boards, the second terminal is electrically connected to the logic board, and the second bendable section and the third bendable section are each at least a portion of the fourth flexible printed circuit board.

9. The display apparatus according to claim 8, wherein each of the third flexible printed circuit boards comprises a main body and at least two first branches connected to the main body, wherein each of the first branches is electrically connected to one of the driver integrated circuits; or the third flexible printed circuit boards are electrically connected to the driver integrated circuits in one-to-one correspondence.

10. The display apparatus according to claim 9, wherein a first terminal of the fourth flexible printed circuit board comprises at least two second branches, wherein each of the second branches is electrically connected to one of the third flexible printed circuit boards; or
the fourth flexible printed circuit board comprises a transversal extension portion extending along a direction in which the driver integrated circuits are arranged, and a longitudinal connection portion perpendicularly connected to the transversal extension portion, wherein the transversal extension portion is electrically connected to at least two of the third flexible printed circuit boards, and the longitudinal connection portion is electrically connected to the logic board.

11. An electronic device, comprising a display screen and a body; wherein the display screen and the body are hinged by a hinge shaft, the body comprises a processor therein; the display screen comprises the display apparatus according to claim 8, and the processor is electrically connected to the interface of the logic board.

12. A display apparatus, comprising:
a flexible display panel comprising a display region and a peripheral region surrounding the display region;
a plurality of driver integrated circuits disposed on a first surface of the flexible display panel and on the peripheral region, wherein the plurality of driver integrated circuits are spaced apart along a first side edge of the flexible display;
a printed circuit board disposed on a second surface of the flexible display panel;
a first flexible printed circuit board comprising a first bendable section, wherein the first flexible printed circuit board comprises one terminal electrically connected to the driver integrated circuits, and the other terminal turned over to the second surface of the flexible display panel via the first bendable section and electrically connected to the printed circuit board, and the second surface and the first surface are two opposite surfaces of the flexible display panel;
a logic board comprising an interface configured to be electrically connected to a processor of an electronic device; and
a second flexible printed circuit board comprising one terminal electrically connected to the printed circuit board, and the other terminal electrically connected to the logic board, wherein the second flexible printed circuit board comprises a second bendable section and a third bendable section, the second bendable section being configured to be turned over at a side where the second surface is disposed, such that the third bendable section and the logic board protrude from the first side edge, and the third bendable section being configured to bypass a hinge shaft of the electronic device.

13. The display apparatus according to claim 12, wherein the logic board comprises at least two first connectors; the other terminal of the second flexible printed circuit board comprises two third branches, each of the third branches comprising one second connector; and the first connectors are electrically connected to the second connectors in one-to-one correspondence, such that the second flexible printed circuit board is electrically connected to the logic board.

14. The display apparatus according to claim 13, wherein the second flexible printed circuit board comprises a single-layer board region and a double-layer board region which are connected to each other, wherein the second bendable section and the third bendable section are both disposed on the single-layer board region, and the second connectors are disposed on the double-layer board region.

15. An electronic device, comprising a display screen and a body; wherein the display screen and the body are hinged by a hinge shaft, the body comprises a processor therein; the display screen comprises the display apparatus according to claim 1, and the processor is electrically connected to the interface of the logic board.

16. The electronic device according to claim 15, wherein the electronic device is one of a notebook computer and a camera.

17. The electronic device according to claim 15, wherein the at least one first flexible printed circuit board and the driver integrated circuits are electrically connected one-to-one correspondence.

18. An electronic device, comprising a display screen and a body; wherein the display screen and the body are hinged by a hinge shaft, the body comprises a processor therein; the display screen comprises the display apparatus according to claim 12, and the processor is electrically connected to the interface of the logic board.

* * * * *

UNITED STATES PATENT AND TRADEMARK OFFICE
CERTIFICATE OF CORRECTION

| | | |
|---|---|---|
| PATENT NO. | : 12,164,335 B2 | Page 1 of 1 |
| APPLICATION NO. | : 17/788437 | |
| DATED | : December 10, 2024 | |
| INVENTOR(S) | : Weihong Wu, Shuang Zhang and Chang Zhang | |

It is certified that error appears in the above-identified patent and that said Letters Patent is hereby corrected as shown below:

On the Title Page

Item (73) The Assignee field should appear as:
(73) Assignees: BEIJING BOE TECHNOLOGY DEVELOPMENT CO., LTD., Beijing (CN); CHENGDU BOE OPTOELECTRONICS TECHNOLOGY CO., LTD., Sichuan (CN)

Signed and Sealed this
Fifth Day of August, 2025

Coke Morgan Stewart
*Acting Director of the United States Patent and Trademark Office*